(12) United States Patent
Clevenger et al.

(10) Patent No.: US 9,082,625 B2
(45) Date of Patent: Jul. 14, 2015

(54) PATTERNING THROUGH IMPRINTING
(71) Applicants: International Business Machines Corporation, Armonk, NY (US); STMicroelectronics, Inc., Coppell, TX (US)
(72) Inventors: Lawrence A. Clevenger, LaGrangeville, NY (US); Carl J. Radens, LaGrangeville, NY (US); Richard S. Wise, Newburgh, NY (US); Yiheng Xu, Hopewell Junction, NY (US); John Zhang, Altamont, NY (US)
(73) Assignees: International Business Machines Corporation, Armonk, NY (US); STMICROELECTRONICS, Inc., Coppell, TX (US)
( * ) Notice: Subject to any disclaimer, the term of this patent is extended or adjusted under 35 U.S.C. 154(b) by 0 days.
(21) Appl. No.: 14/102,873
(22) Filed: Dec. 11, 2013
(65) Prior Publication Data
US 2015/0162194 A1  Jun. 11, 2015
(51) Int. Cl.
B44C 1/22 (2006.01)
H01L 21/033 (2006.01)
H01L 21/306 (2006.01)
H01L 21/02 (2006.01)
(52) U.S. Cl.
CPC ........ *H01L 21/0337* (2013.01); *H01L 21/0217* (2013.01); *H01L 21/0228* (2013.01); *H01L 21/30625* (2013.01)
(58) Field of Classification Search
USPC ........................... 216/41, 44, 54, 88; 438/692
See application file for complete search history.

(56) References Cited

U.S. PATENT DOCUMENTS

| 8,048,354 | B2 | 11/2011 | Landis et al. | |
|---|---|---|---|---|
| 8,298,467 | B2 | 10/2012 | Xu et al. | |
| 8,419,412 | B2 | 4/2013 | Ohsawa et al. | |
| 2006/0063387 | A1* | 3/2006 | Miller et al. | 438/735 |
| 2006/0138080 | A1* | 6/2006 | Hasegawa et al. | 216/44 |
| 2010/0078860 | A1* | 4/2010 | Yoneda et al. | 264/496 |
| 2011/0312180 | A1* | 12/2011 | Wang | 438/692 |
| 2012/0292285 | A1* | 11/2012 | Kontos et al. | 216/12 |
| 2014/0353277 | A1* | 12/2014 | Lee et al. | 216/51 |

FOREIGN PATENT DOCUMENTS

| JP | 2007307752 | 11/2007 |
|---|---|---|
| JP | 2008200997 | 9/2008 |
| JP | 2009208239 | 9/2009 |
| JP | 2010052175 | 3/2010 |
| WO | WO2011138237 | 11/2011 |

OTHER PUBLICATIONS

Hishitani, Daisuke—Forming of SiO2 Film by Spin-On Glass and CO2 Laser Annealing for Gate Insulator of Polycrystalline Silicon Thin Film Transistors—IEEE 2013.
Fillman, Ryan W.—Toward a Universal Anti-Stick Layer for Nanoimprint Lithography Imprinters: Ultra-Thin F-DLC—IEEE 2009—Nanotechnology Materials and Devices Conference.
Park, S.—Improved Anti-Adhesive Coating for Nanoimprint Lithography—PSI Scientific Reports 2003—Laboratory for Micro and Nanotechnology.

* cited by examiner

*Primary Examiner* — Shamim Ahmed
(74) *Attorney, Agent, or Firm* — Yuanmin Cai

(57) ABSTRACT

Embodiments of present invention provide a method of forming device pattern. The method includes defining a device pattern to be created in a device layer; forming a sacrificial layer on top of the device layer; identifying an imprinting mold that, at a position along a height thereof, has a horizontal cross-sectional shape that represents the device pattern; pushing the imprinting mold uniformly into the sacrificial layer until at least the position of the imprinting mold reaches a level inside the sacrificial layer that is being pushed by the imprinting mold; removing the imprinting mold away from the sacrificial layer; forming a hard mask in recesses created by the imprinting mold in the sacrificial layer, the hard mask has a pattern representing the device pattern; and transferring the pattern of the hard mask into underneath the device layer.

21 Claims, 35 Drawing Sheets

PATTERNING THROUGH IMPRINTING

FIELD OF THE INVENTION

The present invention relates generally to the field of semiconductor device manufacturing and in particular relates to method of creating device patterns in a semiconductor substrate and other types of device materials.

BACKGROUND

Nano-imprint patterning (NIP) process is widely considered as a promising patterning process or method that offers various features and benefits such as high resolution, high critical dimension (CD) uniformity, and relatively low cost of manufacturing when being compared with other traditional patterning processes or methods such as, for example, the commonly used lithographic exposure based patterning process. The process of current NIP method generally includes first creating a pattern in a resist layer by pressing a mold into the resist layer to shape the resist layer into the desired pattern, and then transferring the pattern directly from the resist layer to the underneath substrate.

Nevertheless, current NIP process is also known, in general, as having a relatively high defect rate due to, for example, impurity of material and/or imperfection of the process or tools. The defects have been mainly observed in two categories: 1) randomly distributed defects and 2) repeated defects. More specifically, randomly distributed defects may include, for example, particle-associated defects, gap or void associated defects, separation related defects, and defects due to residual after imprint, all of which are not repeatable in terms of location and amount. For example, gap associated defect may be induced by incomplete contact between mold and imprinting material such as resist. Repeated defects may include those that are caused by existing defects on mold and/or on substrate. For example, defects in a mold may be reflected repeatedly in patterns manufactured by using that same mold. The above issues relating to defects in the current NIP process are impeding the practical and wide use of this otherwise promising technology in semiconductor device manufacturing.

SUMMARY OF EMBODIMENTS OF THE INVENTION

Embodiments of present invention provide a method of utilizing a tone reversal imprinting process to help improve current nano-imprint patterning process. According to embodiments of present invention, imprinting material and a sacrificial hard mask are used in the process, both of which are later removed after the pattern has been formed. When being compared with what is commonly seen in a traditional imprinting method, the imprinting method of present invention possesses significantly less defect issues. In addition, this new and improved imprinting method provides cost advantage over traditional lithographic exposure based patterning process. For example, this new and improved method is scalable and thus may be designed to manufacture devices of nano-scale by using imprinting mold having nano-scale pins, which may further reduce manufacturing cost. Moreover, embodiments of present invention provide patterning design flexibility by using different kinds of imprinting molds. It also has high throughput when being compared to conventional lithographic patterning method.

More specifically, embodiments of present invention provide a method of forming various device patterns. The method includes defining a device pattern to be created in a device layer; forming a sacrificial layer on top of the device layer; identifying an imprinting mold that, at a position along a height thereof, has a horizontal cross-sectional shape that represents the device pattern; pushing the imprinting mold uniformly into the sacrificial layer until at least the position of the imprinting mold reaches a level inside the sacrificial layer that is being pushed by the imprinting mold; removing the imprinting mold away from the sacrificial layer; forming a hard mask in recesses created by the imprinting mold in the sacrificial layer, the hard mask has a pattern representing the device pattern; and transferring the pattern of the hard mask into underneath the device layer.

According to one embodiment, forming the sacrificial layer includes forming a layer of material, the material being selected from a group consisting of siloxane copolymer, thermally-curable liquid resist, UV-curable liquid resist, sealed air Nexcel, and shrink film 955D.

According to another embodiment, forming the hard mask includes depositing a layer of silicon-nitride on top of the sacrificial layer and recesses in the sacrificial layer by an atomic layer deposition (ALD) process; and polishing down deposited silicon-nitride, and subsequently a portion of the sacrificial layer, until a top surface created by the polishing reaches the level inside the sacrificial layer, creating the hard mask by using remaining of the silicon-nitride inside the sacrificial layer.

According to yet another embodiment, transferring the pattern of the hard mask includes directionally etching portions of the sacrificial layer that do not have the hard mask embedded on top thereof to expose corresponding portions of underneath the device layer; continuing etching exposed portions of the device layer until a predetermined depth into the device layer is reached; and removing remaining portions of the sacrificial layer on top of the device layer.

In one embodiment, the method further includes, before forming the hard mask in the recesses, cooling down the sacrificial layer to cause the sacrificial layer to shrink thereby resulting in a reduction in a pitch of the recesses.

In another embodiment, the method further includes, before forming the hard mask in the recesses, warming up the sacrificial layer to cause the sacrificial layer to expand thereby resulting in an expansion in a pitch of the recesses.

According to one embodiment, pushing the imprinting mold into the sacrificial layer includes causing the sacrificial layer to rise in height in places where the imprinting mold does not touch the sacrificial layer.

According to another embodiment, the imprinting mold has a first and a second group of pins, and wherein the second group of pins does not touch the sacrificial layer when the imprinting mold is uniformly pushed into the sacrificial layer.

BRIEF DESCRIPTION OF THE DRAWINGS

The present invention will be understood and appreciated more fully from the following detailed description of preferred embodiments, taken in conjunction with the accompanying drawings of which.

Figure 1:
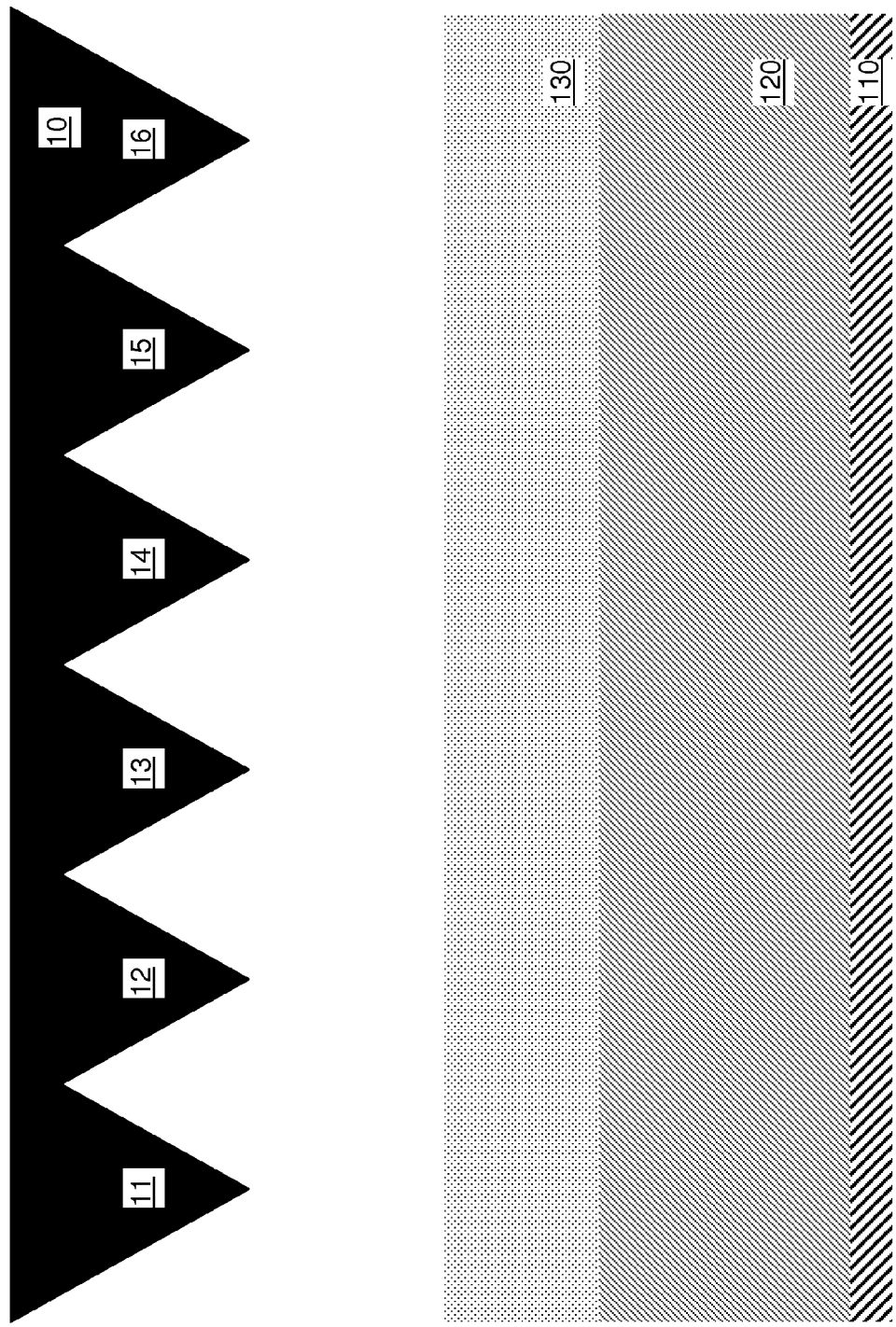
FIGS. 1-7 are demonstratively illustrations of a method of patterning a layer of material according to one embodiment of present invention.
Figure 2:
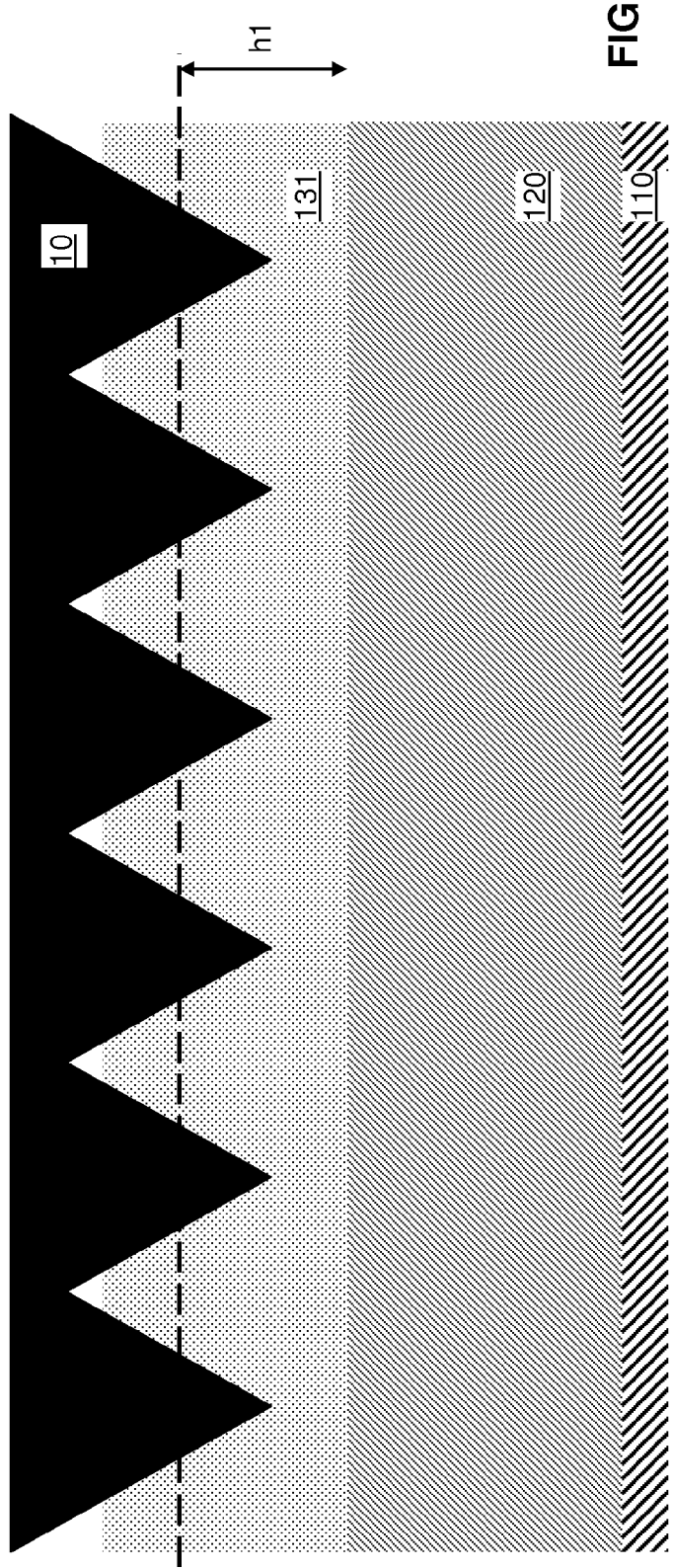

It will be appreciated that for purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIGS. 1-7 are demonstratively illustrations of steps of a method of patterning a layer of material according to embodiments of present invention. For example, the method may include patterning a layer 120 of suitable material such as dielectric material including silicon-nitride (SiN) or silicon-oxide (SiO2). However, embodiments of present invention are not limited in this respect and layer 120 may be a semiconductor substrate such as a silicon (Si) substrate or silicon-germanium (SiGe) substrate. In the below description, for simplicity without losing generality, layer 120 is described as a dielectric layer and may be formed on top of another layer 110 which may be, for example, a semiconductor substrate layer.

In order to pattern layer 120, one embodiment of present invention includes forming a layer 130 directly on top of layer 120. Layer 130 may be made of materials suitable for imprinting such as, for example, siloxane copolymers, liquid resists that are fast thermally curable, UV-curable liquid resists suitable for room-temperature nano-imprinting, sealed air Nexcel, multilayer shrink film 955D, and/or other existing or future developed materials suitable for the purpose. Depending on the nature of the imprinting material, layer 130 may be applied onto layer 120 through a deposition process or may be applied onto layer 120 through a spin-on process.

In one embodiment, the method may include imprinting a pattern of reverse tone into layer 130, or in other words imprinting a pattern in layer 130 that is tone reversal to a pattern that is to be formed in layer 120. For example, with respect to areas of layer 120 that are designed to remain as a device pattern, recesses may be created in corresponding areas of layer 130 directly above these areas of layer 120. In order to perform this imprint into layer 130 an imprinting mold, such as a mold 10, 20, 30, 40, or 50, as being demonstratively and respectively illustrated in FIG. 1, 11, 14, 17, 24, may be used. In fact, any imprinting mold that has one or more pins and has a horizontal pattern of the pins, at a depth along the height of the mold, representing a device pattern to be formed in layer 120 may be used. The pins are generally facing a direction vertical to the base of the imprinting mold and have sharp heads for ease of being pushed into imprint material such as layer 130.

In addition to device patterns offered by the imprinting mold, materials that form the imprinting mold may be important as well. Consideration for selecting mold materials may include, for example, hardness, compatibility with traditional micro-fabrication processing for the intended applications, and thermal expansion coefficient of the material. According to one embodiment of present invention, candidate material for making imprinting mold may include, for example, silicon (Si), silicon-dioxide (SiO2), silicon-nitride (SiN), nitride (Ni), or other metals, sapphire, and/or diamond film.

Reference is now made back to FIG. 1, where mold 10 has multiple pins 11-16 and each pin has a triangle shape pointing downward and is horizontally aligned with each other. Thus, mold 10 may be able to provide a pattern of multiple lines that have a same width horizontally. Width of the multiple lines depends on to which extent mold 10 is pushed into an imprinting material, such as layer 130, and thus the width may vary along the height of mold 10. In particular, width of the multiple lines provided by mold 10 increases at a height further away from tips of the pins.

Before imprinting, a self-aligned monolayer of anti-sticking coating (not shown in FIG. 1) may be optionally applied to the bottom surface of mold 10 to help reduce defects during imprinting. Such an anti-sticking coating may include, for example, a fluorinated monolayer coating formed through co-evaporation of fluorinated mono- and trichlorosilanes, or a fluorinated diamond-like carbon layer formed through plasma deposition. As being demonstratively illustrated in FIG. 2, one embodiment of present invention includes applying mold 10 against imprinting material layer 130 and then pushes mold 10 uniformly into imprinting material layer 130. As a result, some of the imprinting material of layer 130 may be squeezed into spaces between the pins of mold 10, where mold 10 does not touch layer 130, to be above height h1 of the original imprinting material layer 130. The process of pushing mold 10 into imprinting material layer 130 may stop anywhere after top or top surface of the imprinted layer 131 passes a height of mold 10 where mold 10 has a cross-section shape that represents the desired device pattern to be made in layer 120, but before or when the squeezed imprinting material (or top of imprinted layer 131) reaches the top of gaps between any two of the pins which may present a resistance preventing mold 10 from being pushed further down into imprinting material layer 130.

Figure 3:
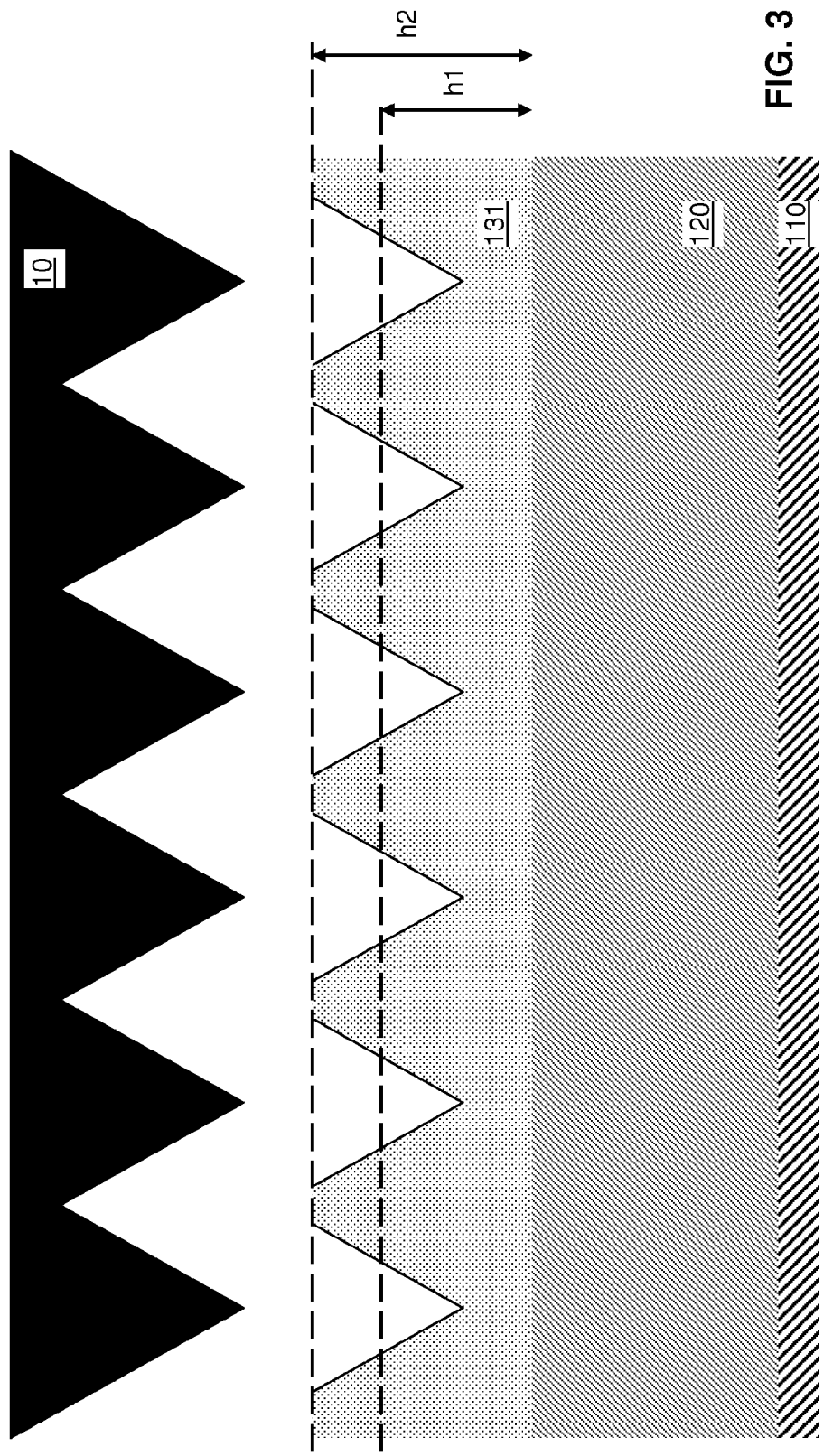

Next, as being demonstratively illustrated in FIG. 3, mold 10 may be pulled back away from imprinting layer 130, resulting in an imprinted layer 131 that has a height h2 higher than h1 of the original imprinting material layer 130. Imprinted layer 131 represents the shape of at least a lower portion of pins 11-16 of mold 10. In other words, imprinted layer 131 has a shape that is a complementary shape to at least a lower portion of pins 11-16 of mold 10.

According to one embodiment of present invention, thermal expansion or extraction properties of the imprinted layer 131 may be used to provide adjustment to the pitch of imprinted patterns of recesses. In order to enhance the above pitch adjustment, materials that are particularly thermally sensitive to be expansible or shrinkable may be used to make imprinting material layer 130. For example, as being listed above, siloxane copolymers and other thermally or UV-curable liquid resists may be used for their thermal expansion property, while other materials such as sealed air Nexcel or multilayer shrink film 955D may be used for their property of being able to shrink.

When applying the thermal sensitivity of imprinting material in the process of making patterns, imprinting material layer 130 may first be made into an imprinted layer 131 under a first temperature, which may be relatively high or low depending upon the type of material used. The imprinted layer 131 is then brought to an environment of a second temperature that is different from the first temperature, and thus creating a change in the pitch of imprinted pattern because of the shrinking or expansion of material of the imprinted layer 131. In addition, in order to accommodate change in size of this imprinted layer 131, Ker fine in the wafer may be used as extra buffering space. Alternatively, spaces that are used for die local function separation may be used as well.

Figure 4:
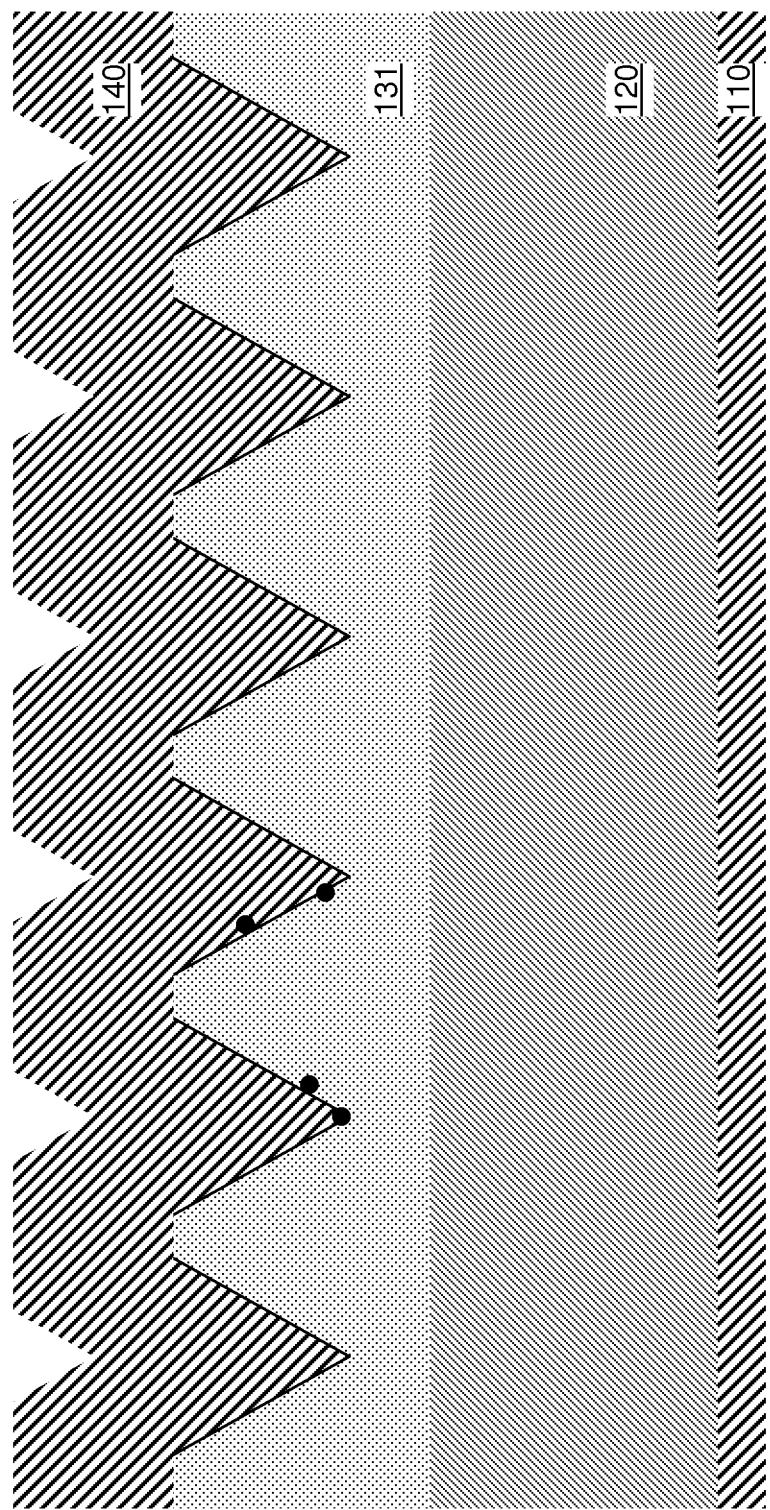

As being demonstratively illustrated in FIG. 4, one embodiment of present invention includes subsequently depositing a hard mask layer 140 on top of the imprinted layer 131. Hard mask layer 140 may be, for example, a silicon-nitride (SiN) layer and may be deposited through an atomic layer depositing (ALD) process. Other materials such as those that are initially soft and thus be able to fill up recesses of the imprinted pattern of layer 131 and be solidified subsequently may be used as well. Such materials may include, but are not limited to, spin-on-glasses (SOG) such as per-hydro-polysilazane (PHPS) that may be applied through a spin-on process.

Figure 5:
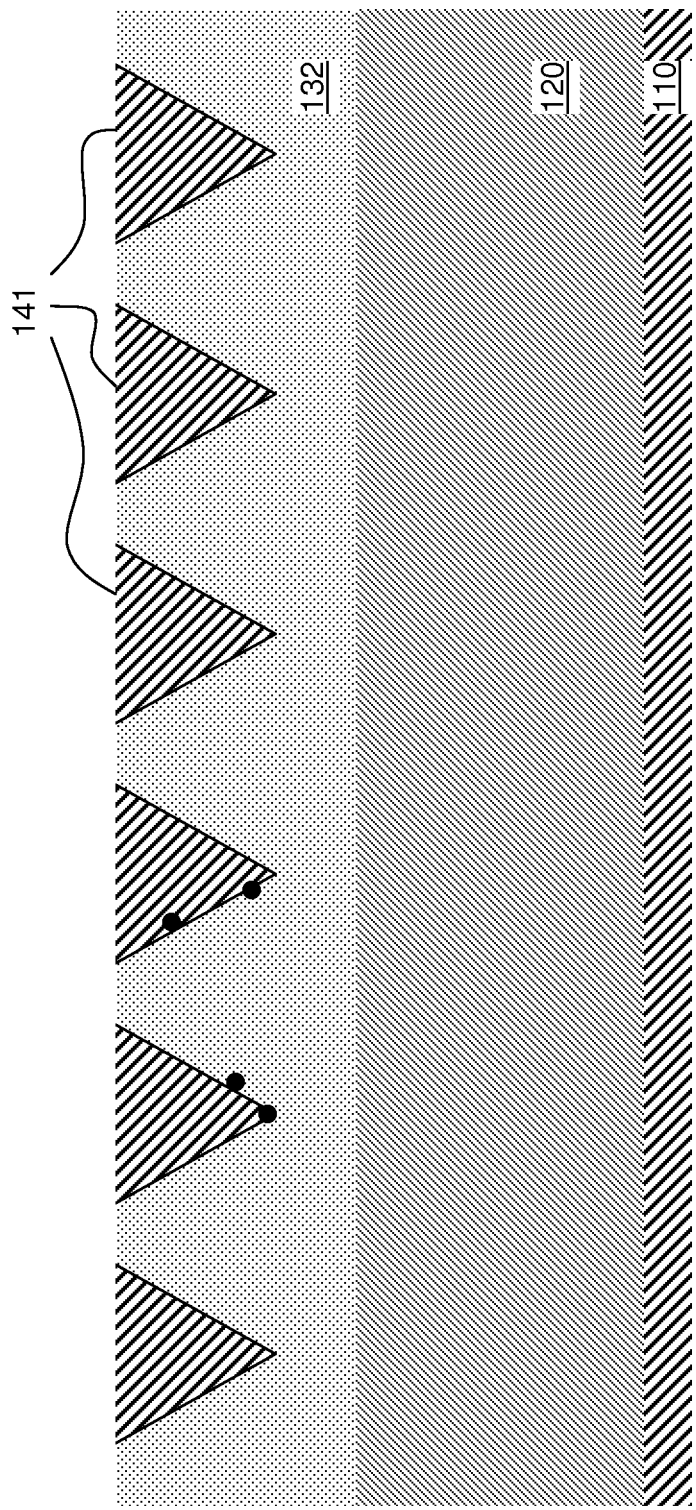

Next, one embodiment of present invention includes applying a chemical-mechanic-polishing (CMP) process to remove at least those excessive hard mask material 140 that are above imprinted layer 131, as being demonstratively illustrated in FIG. 5. Depending upon how deep mold 10 was imprinted into imprinted layer 131, in one embodiment, the CMP process may further be applied to polish down imprinted layer 131 until it is exposed a cross-sectional shape of hard mask 141 that represents a pre-determined imprinting pattern or device pattern to be made in layer 120, and imprinted layer 131 becomes modified imprinted layer 132. The pre-determined imprinting pattern corresponds to a cross-sectional shape of mold 10 at a particular height.

Figure 6:
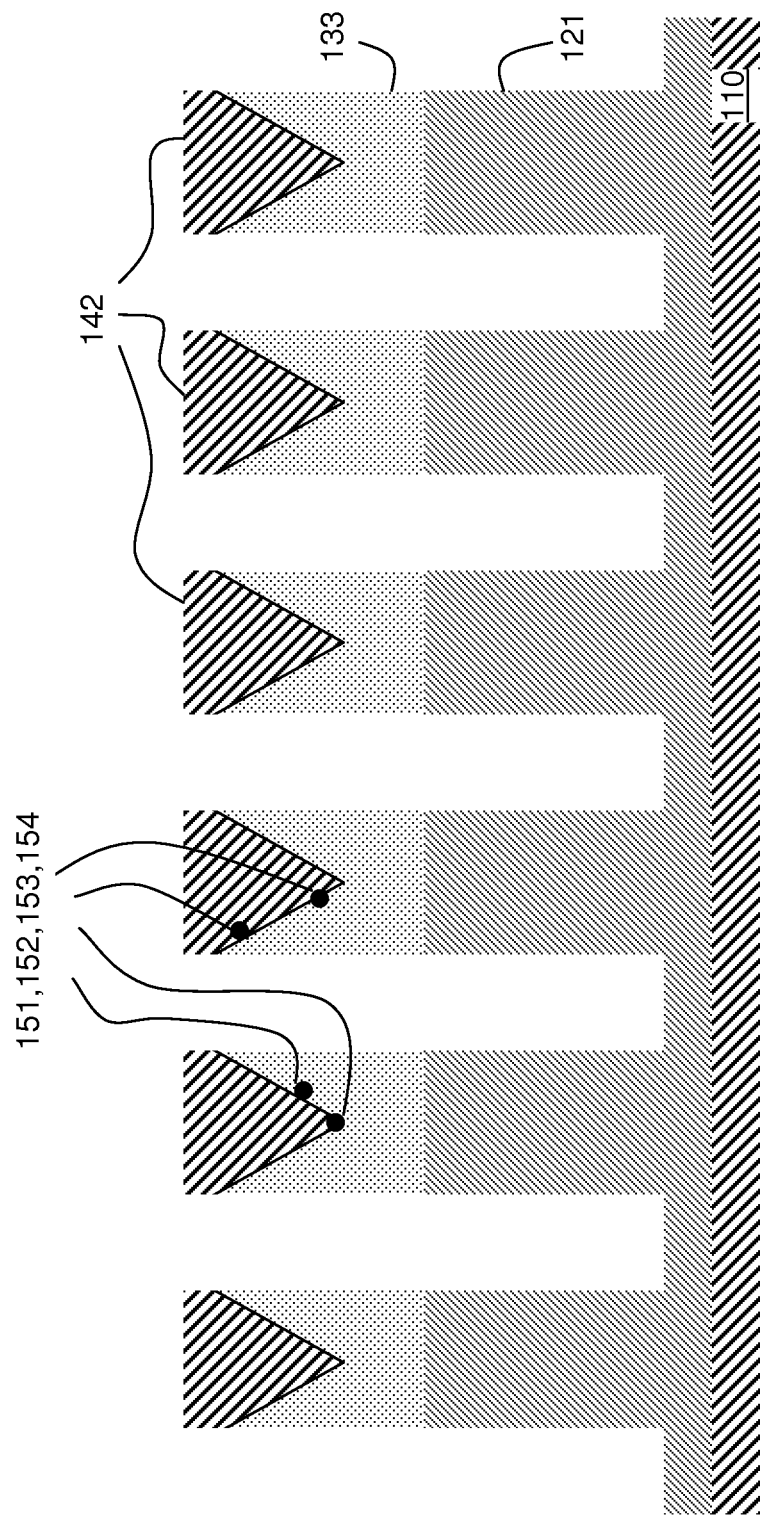

With hard mask layer 141 covering portions of imprinted layer 132, embodiment of present invention includes applying a reactive-ion-etching (RIE) process to etch imprinting material of layer 132 that are between hard masks 141 to create an etched layer 133, and the pattern of etched layer 133 may further be transferred to underneath dielectric layer 120 which thus becomes etched dielectric layer 121, as being demonstratively illustrated in FIG. 6. In other words, the patterning of dielectric layer 120 may be accomplished through transferring a pattern that was made into imprinting material layer 133.

Depending upon material of hard mask 141 and etchant used in the RIE process, in one embodiment the RIE process may slightly etch edges of hard mask 141 creating openings between hard masks 141 that are slightly bigger than initially exposed width of imprinting material 132. This change in width of opening may be compensated by polishing hard mask 140 in FIG. 4 slightly less to have hard masks 141 of slightly bigger width, or by using different molds such as mold 20 in creating the recesses, which is described below in more details with reference to FIGS. 11-13.

In FIG. 6 (and similarly in FIGS. 4 and 5), it is demonstratively illustrated that in the process of forming hard mask 141, imperfections and/or defects 151-154 may be created or formed along an interface between hard mask 141 and imprinted layer 131. However, as being made clear in the above description, imperfections and/or defects 151-154 do not play any role in affecting the formation of patterns into dielectric layer 120. This is because most of the defects are formed at the interface between hard mask 141 and imprinted layer 131 and thus are shielded by hard mask 141 from affecting the creation of pattern inside imprinted layer 131 and the subsequent transferring of the pattern from etched layer 133 into underneath dielectric 120.

Figure 7:

As being demonstratively illustrated in FIG. 7, after the pattern transferring, hard mask 142 and etched imprinting material layer 133 may be removed using either dry or wet etching processes currently known or future developed. The removal of hard mask 142 and etched layer 133 may together remove all of the imperfections 151-154 which leaves no trace in patterned dielectric layer 121.

Figure 8:
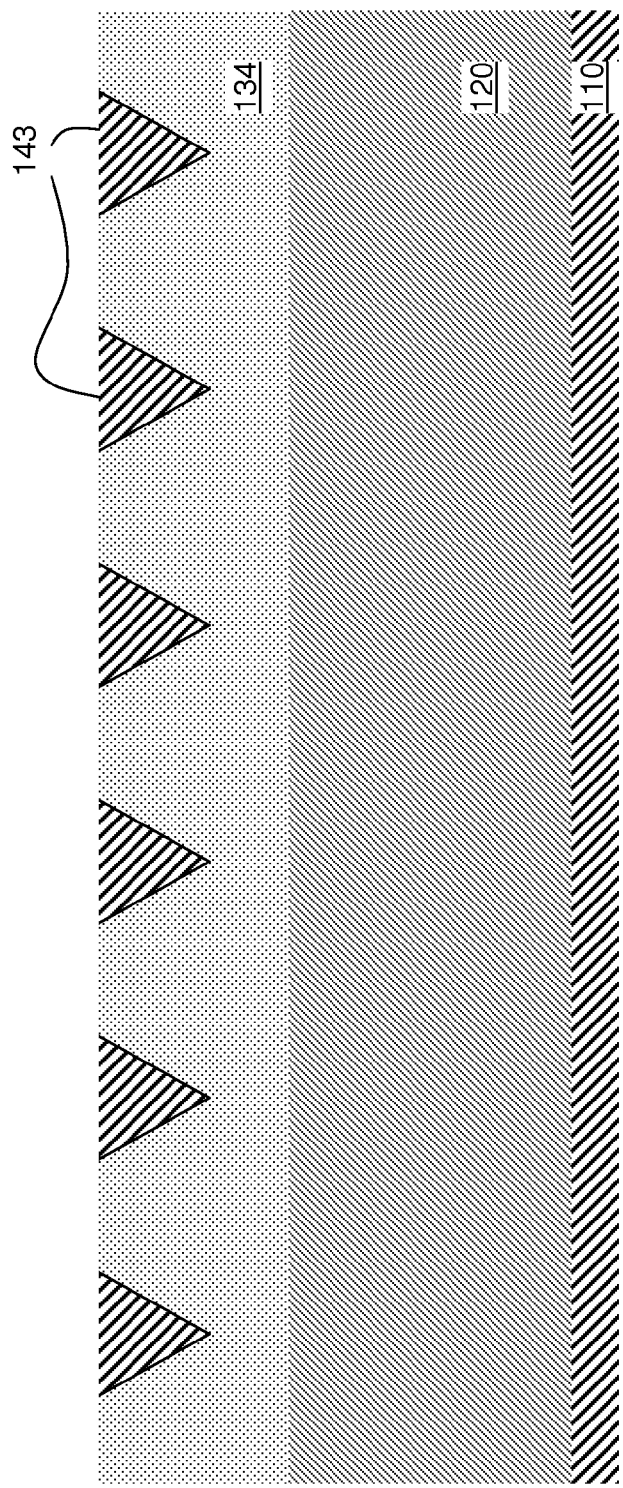
FIGS. 8-10 are demonstratively illustrations of a method of patterning a layer of material according to another embodiment of present invention.
Figure 9:
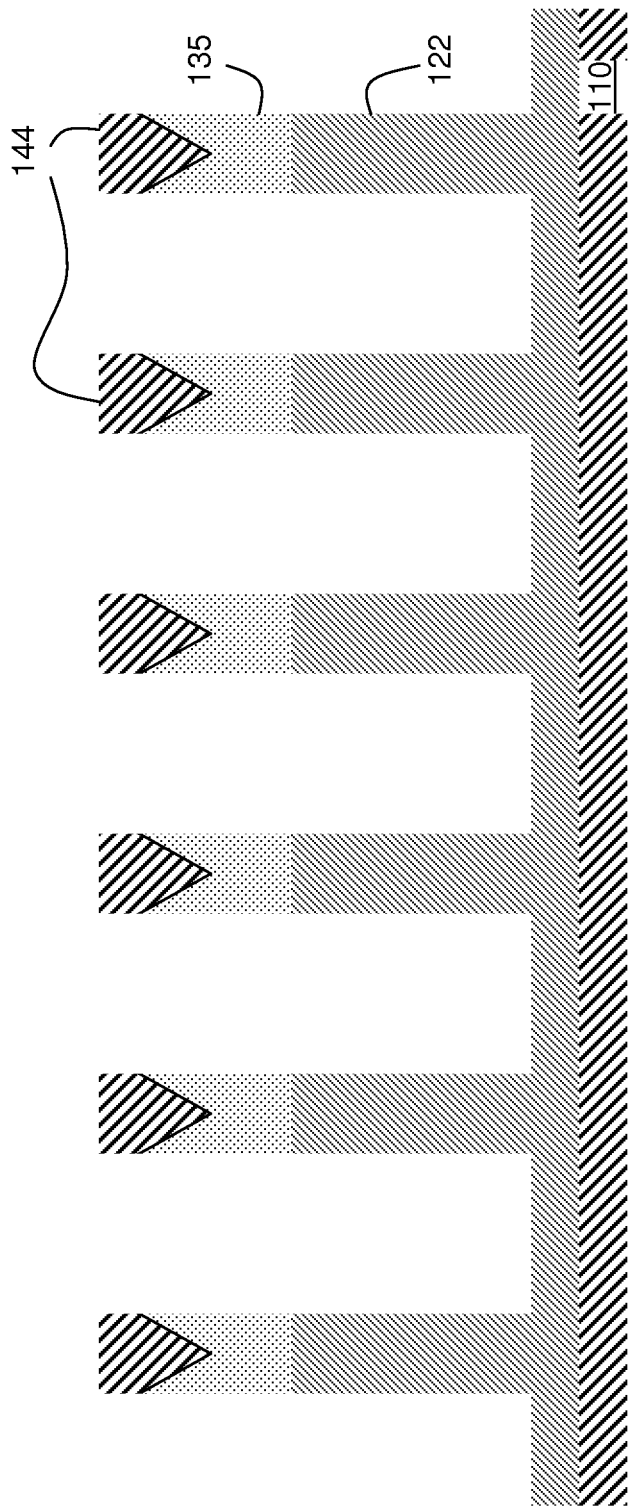
Figure 10:
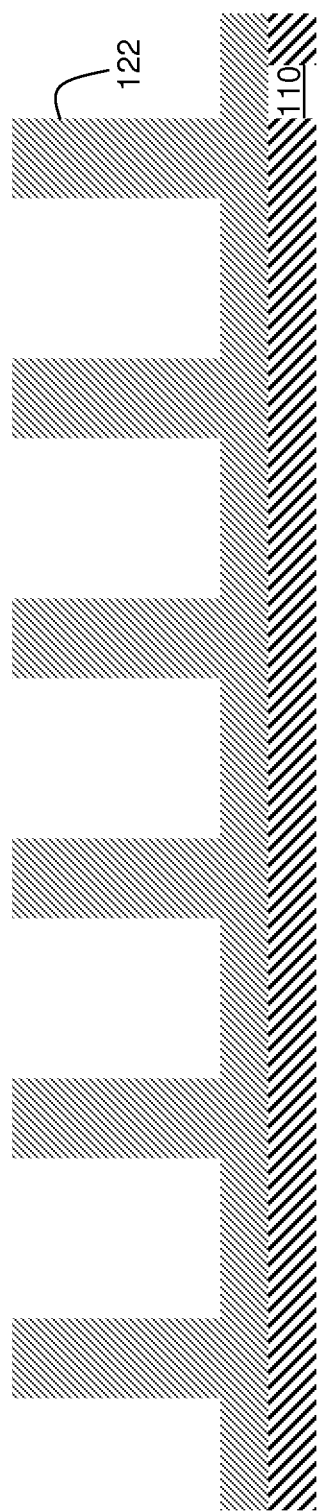

FIGS. 8-10 are demonstratively illustrations of a method of patterning a layer of material according to another embodiment of present invention. As being described above with reference to FIG. 4, in one embodiment, hard mask 140 may be polished down into imprinted layer 131 to achieve different widths of device pattern. For example, as being demonstratively illustrated in FIG. 8, hard mask 140 may be polished down to a level below that shown in FIG. 5 such as to create a hard mask pattern 143 that has a width that is narrower than that of hard mask 141. Consequently, when hard mask 143 is used as an etch-stop layer in a follow-up etching process of imprinted layer 134, openings with wider width may be created in imprinted layer 135 as being demonstratively illustrated in FIG. 9, with hard mask 143 being slightly etched at edges to become 144. The etching of imprinted layer 134 may continue into underneath dielectric layer 120, resulting in the pattern of openings in etched layer 135 being transferred into underneath dielectric 120 thus creating a patterned layer 122. Patterning of dielectric layer 120 may be accomplished after hard mask 144 and etched imprinting material layer 135 are removed from the top thereof, as being demonstratively illustrated in FIG. 10.

Figure 11:
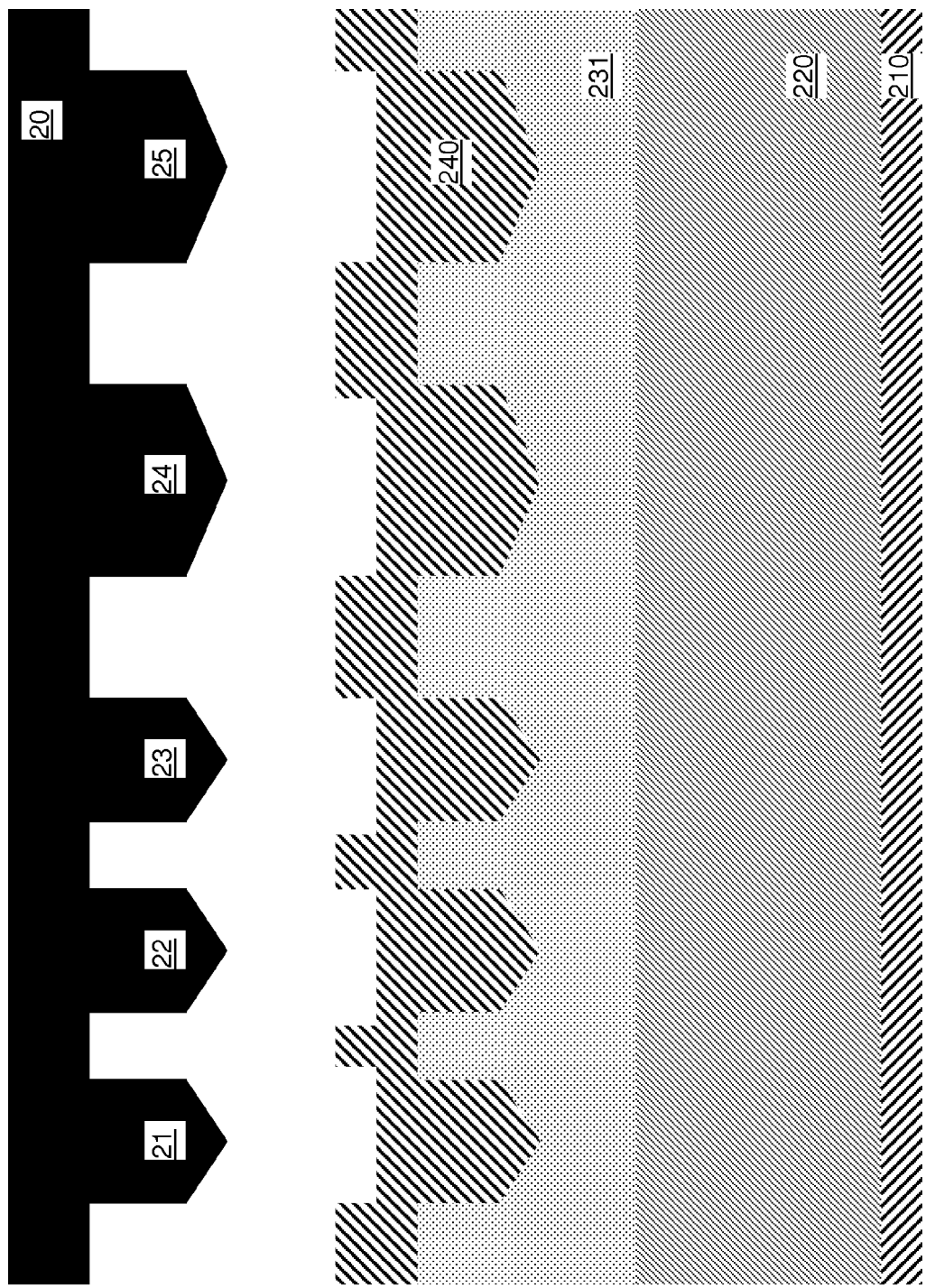
FIGS. 11-13 are demonstratively illustrations of a method of patterning a layer of material according to yet another embodiment of present invention.
Figure 12:
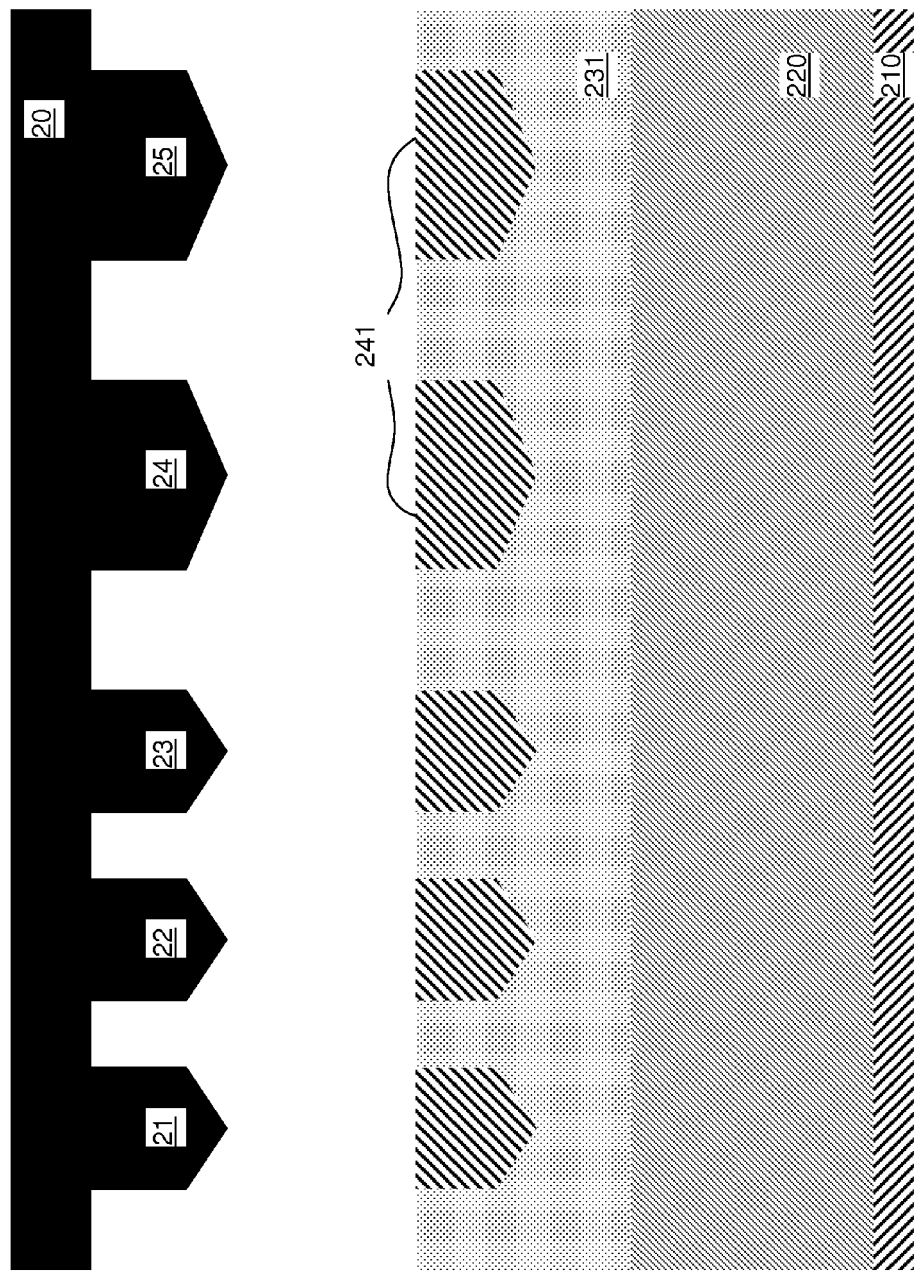
Figure 13:
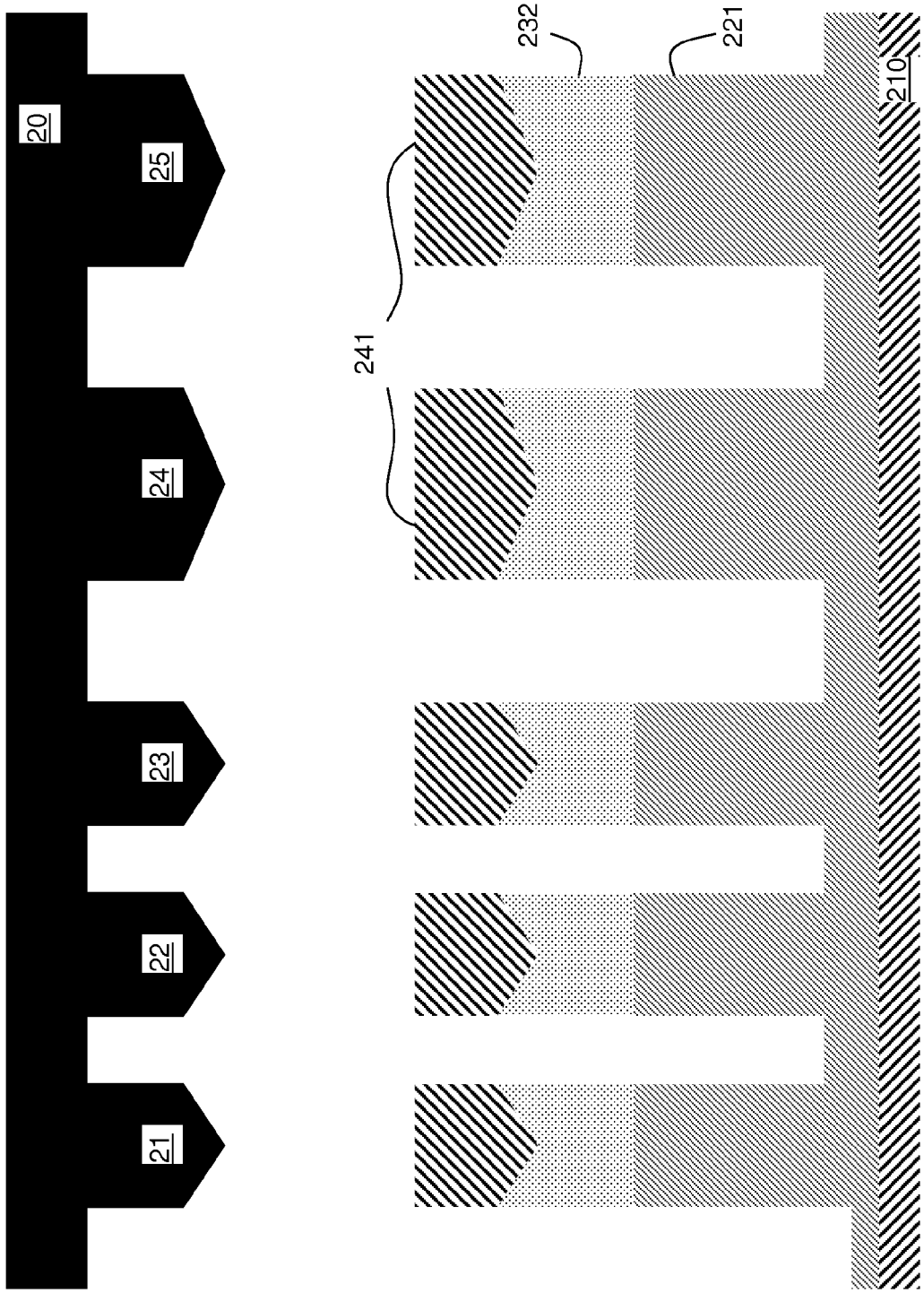

FIGS. 11-13 are demonstratively illustrations of a method of patterning a layer of material according to yet another embodiment of present invention. As being described above, mold 10 in FIG. 1 has pins of triangle shape which creates varying width along a height of the pins. In contrary, as being demonstratively illustrated in FIG. 11, mold 20 has pins 21-25 that each, in a section thereof, has a constant width along its height. In one embodiment, pins 21-25 may have different widths among themselves to meet any specific imprinting needs. In FIG. 11, embodiment of present invention includes providing a dielectric layer 220 on top of a substrate layer 210, and creating an imprinted layer 231 of imprinting material, using mold 20, and subsequently depositing a hard mask layer 240 on top of imprinted layer 231.

Next, as being demonstratively illustrated in FIG. 12, a CMP process may be applied to polish hard mask layer 240 to remove excess imprinting material that are above a top level of imprinted layer 231, leaving hard mask material only inside the recesses of imprinted layer 231 to create hard masks 241. When being compared with the step illustrated in FIG. 5 using mold 10, embodiment of present invention illustrated in FIG. 12 provides a hard mask with a constant hard mask width of each pins which are, to certain extent, not affected by the CMP polishing process. In other words, the CMP process may be made further into imprinted layer 231 without affecting the hard mask width, providing more control of the intended imprinting pattern.

After creating hard masks 241 through polishing, portions of imprinted layer 231 that are not covered by hard masks 241 may be etched away through, for example, a RIE process resulting in the imprinting pattern in an etched layer 232, as being demonstratively illustrated in FIG. 13. The etching process may be continued further until the imprinting pattern or imprinting device pattern is transferred down into dielectric layer 220 creating a patterned dielectric layer 221. Hard masks 241 and etched imprinting layer 232 may be removed subsequently leaving only patterned dielectric layer 221 on top of substrate 210.

Figure 14:
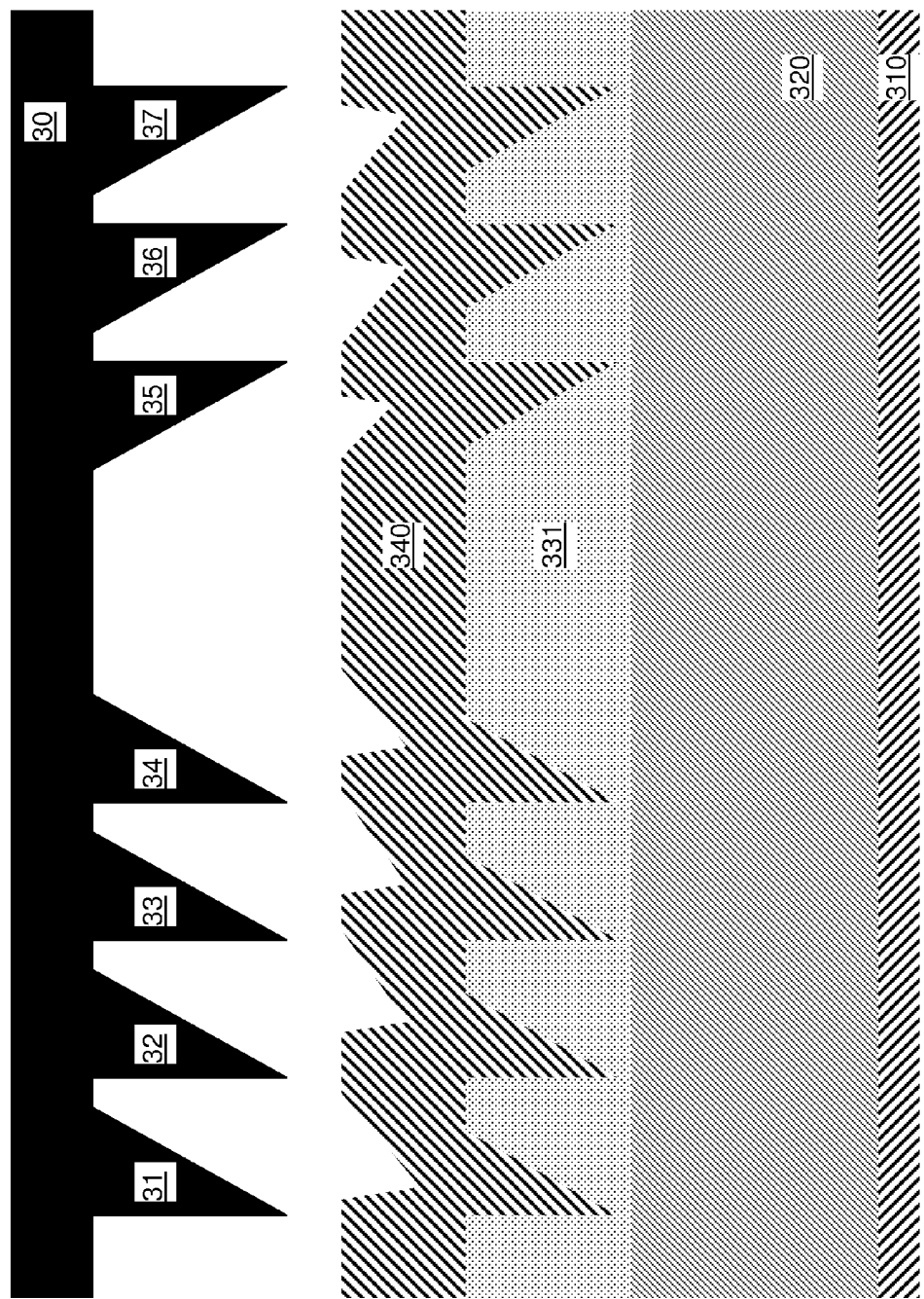
FIGS. 14-16 are demonstratively illustrations of a method of patterning a layer of material according to one more embodiment of present invention.
Figure 15:
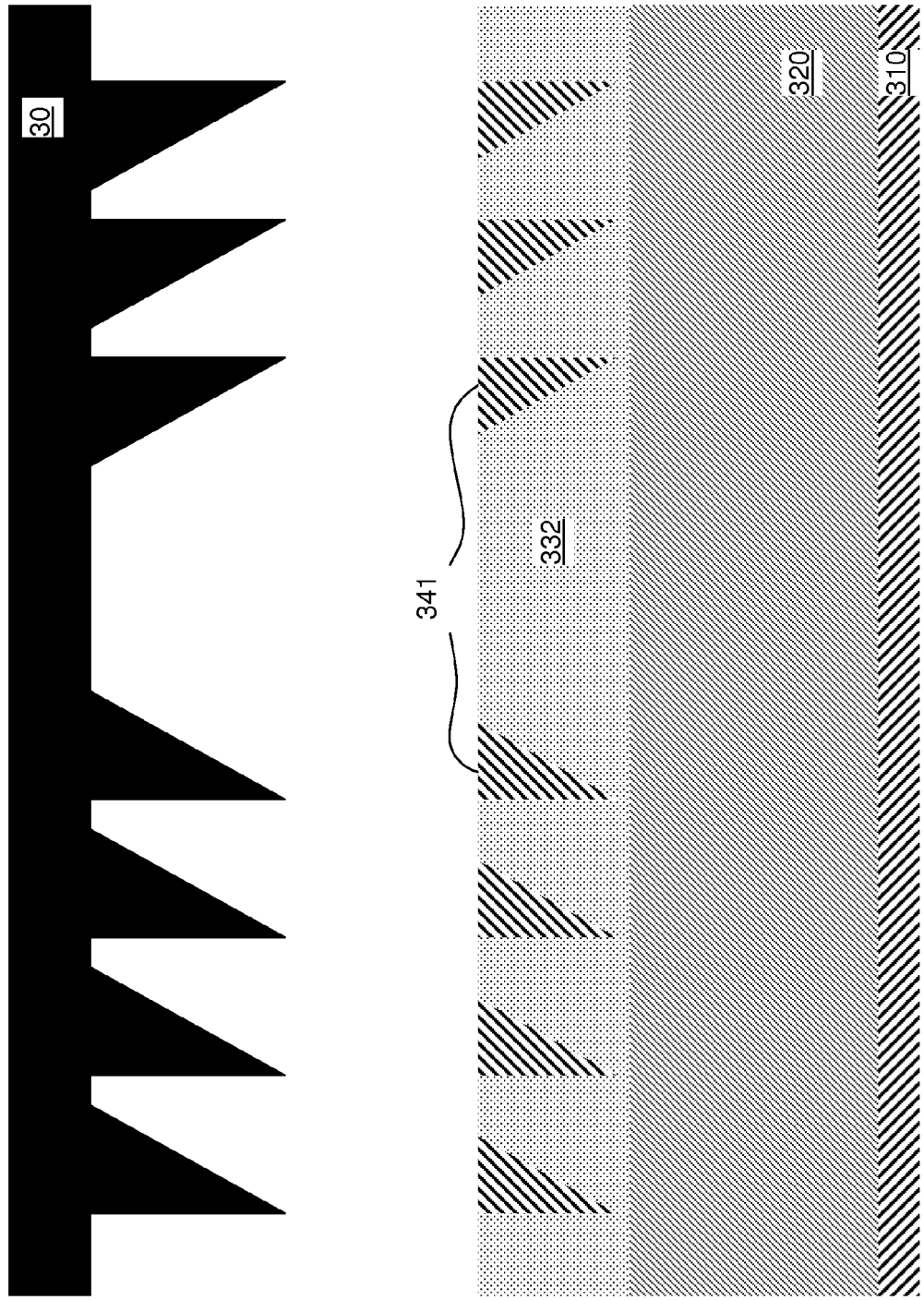
Figure 16:
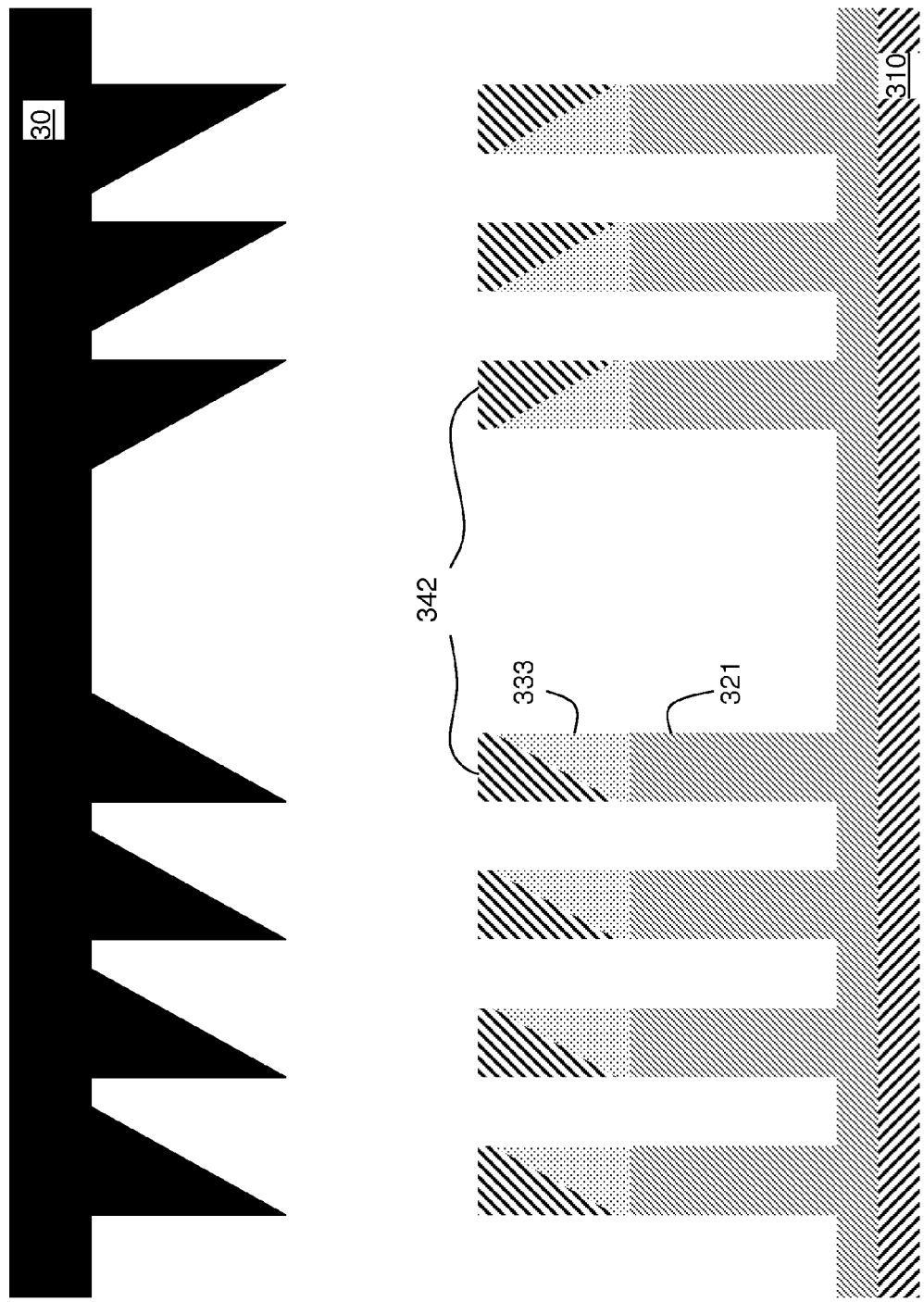
Figure 17:
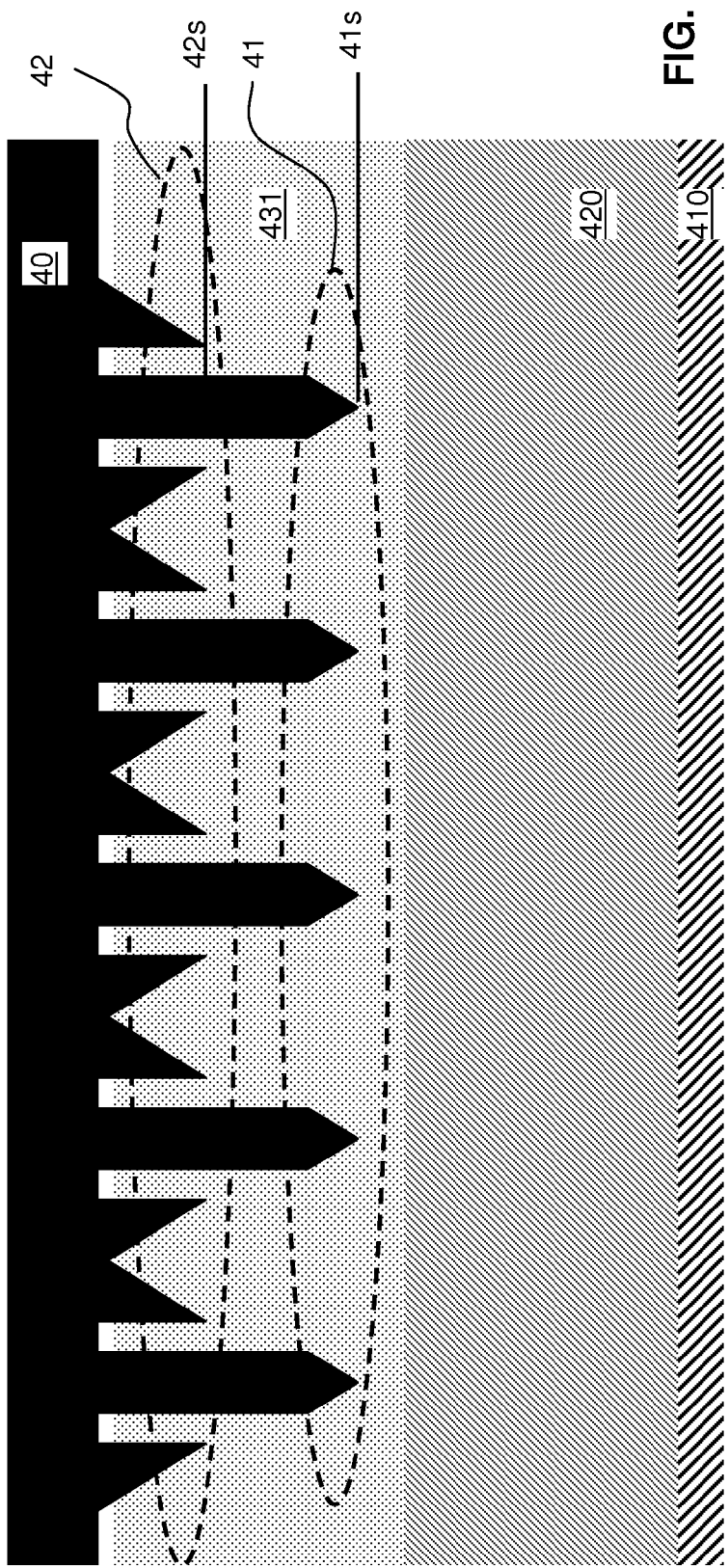
FIGS. 17-21 are demonstratively illustrations of a method of patterning a layer of material according to one embodiment of present invention.

FIGS. 14-16 are demonstratively illustrations of a method of patterning a layer of material according to one more embodiment of present invention. Compared with molds 10 and 20 illustrated in FIGS. 1 and 11, FIG. 14 demonstratively illustrates a mold 30 that has pins 31-37. Unlike pins 11-16 of mold 10, pins 31-37 has one edge that is vertically straight such that position of the edge does not change along the height of pins. On the other hand, pins 31-37 has another edge that changes position along the height of pins and therefore creating a width that changes with the height of pins unlike pins 21-25 that keep a constant width along the height of pins.

One embodiment of present invention includes applying mold 30 in creating an imprinted layer 331 and then depositing a hard mask 340 on top thereof as being demonstratively illustrated in FIG. 14 in order to create pattern in a dielectric layer 320 which sits on top of a substrate layer 310. Excessive material of hard mask layer 340 is then removed by applying, for example, a CMP process and optionally the CMP process may be applied to remove a portion of imprinted layer 331 until a pre-determined hard mask width of hard mask 341 is achieved, as being demonstratively illustrated in FIG. 15. Subsequently, imprinted layer 332 and underneath dielectric layer 320 may be etched in a RIE process, for example, using hard masks 341 as etch-stops. In some embodiments, edges of one side of hard mask 341 may be etched slightly while the other side remains the same anchoring where the pattern should be. The etched layer 333 and hard masks 342 on top thereof may be removed resulting in dielectric layer 320 be transformed into patterned layer 321.

Figure 31:
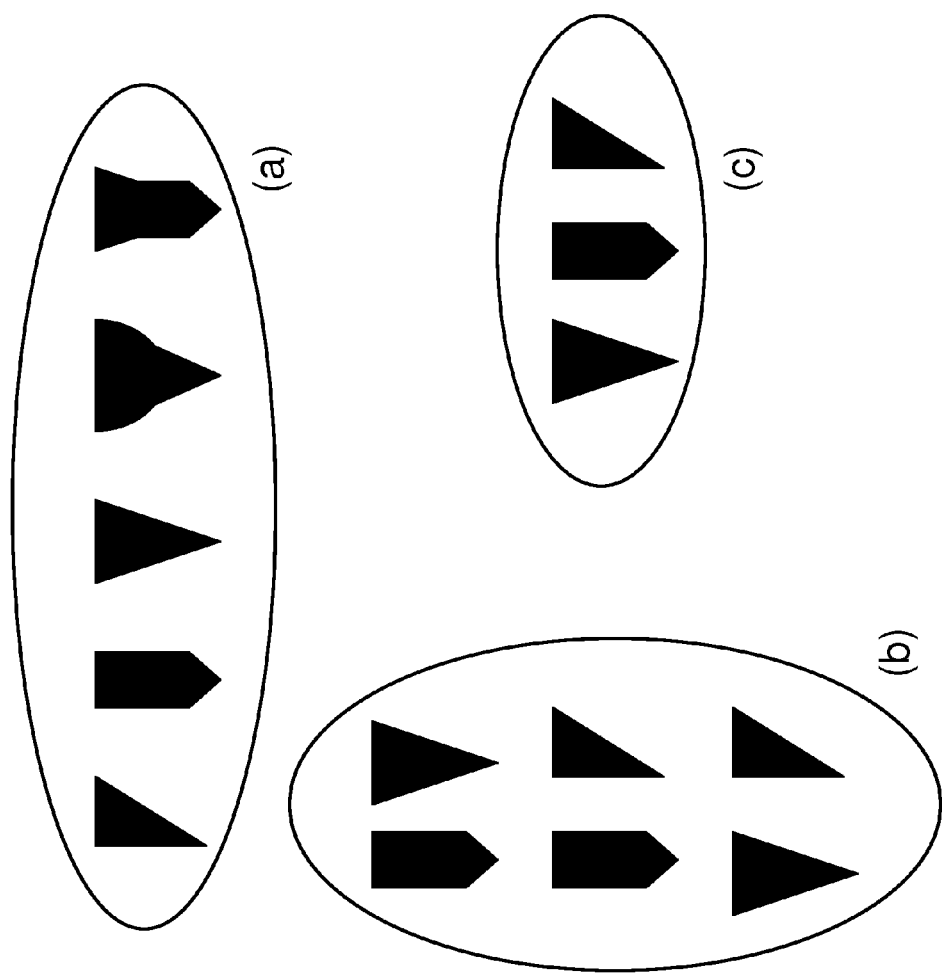
FIGS. 31-35 are demonstratively illustrations of shapes of various pins and molds used in patterning according to embodiments of present invention.

Different from using mold 10 and mold 20, the use of mold 30 enables the flexibility of adjusting hard mask widths and in the meantime maintains relative positions where each pins of hard mask 341 starts. Furthermore, based upon above embodiments of present invention, a person skilled in the art will appreciate that molds employing other types of pins and/or a combination of different types of pins may be used depending upon any specific design needs. Some of the typical pin types are demonstratively illustrated in FIG. 31 together their possible combinations.

It is further to be pointed out that embodiment of present invention is scalable. For example, by employing molds with extreme fine pins that are much narrower than those demonstratively illustrated above in FIGS. 1, 11, and 14, and more specifically using pins of nanometer scale size, nano-imprinting may be made in an imprinting material layer which then may be transferred to a dielectric layer or semiconductor substrate to make nano-scale devices such as, for example, nanotubes.

As being demonstratively illustrated above in FIGS. 1, 11, and 14, molds 10, 20, and 30 all have pins that have the same height. In other words, tips of the pins all lay on a same common plane such that they start touching imprinting material layer 130, 230, or 330 as substantially same time when the imprinting process starts. However, embodiments of present invention are limited in this aspect and molds with other types of pin arrangement may be used as well.

FIGS. 17-21 are demonstratively illustrations of a method of patterning a layer of material according to one embodiment of present invention. More specifically, a mold with multi-level starting planes of pins may be used in an imprinting process. For example, mold 40 may have a first group of pins 41 that starts at a first plane and a second group of pins 42 that starts at a second plane. When being pushed into imprinting material layer 431, the first group of pins 41 may go further deeper into imprinted layer 431 when the second group of pins, as being demonstratively illustrated in FIG. 17. The advantage of a mold having multi-level pins includes increased flexibility of producing patterns using a single mold. For example, by applying mold 40, embodiment of present invention may produce patterns that have different widths but also different spacing as being described below in more details.

Figure 18:
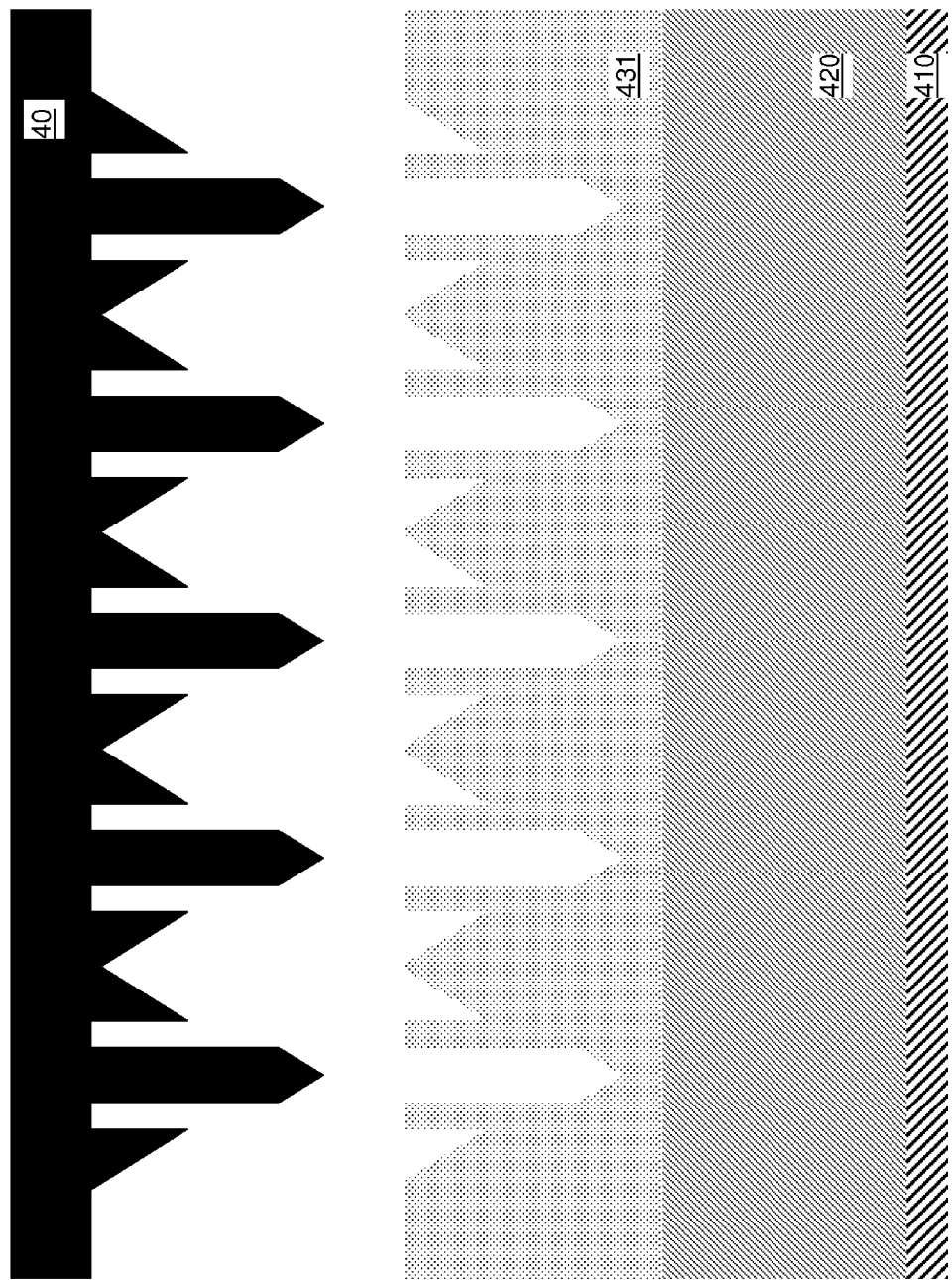
Figure 19:
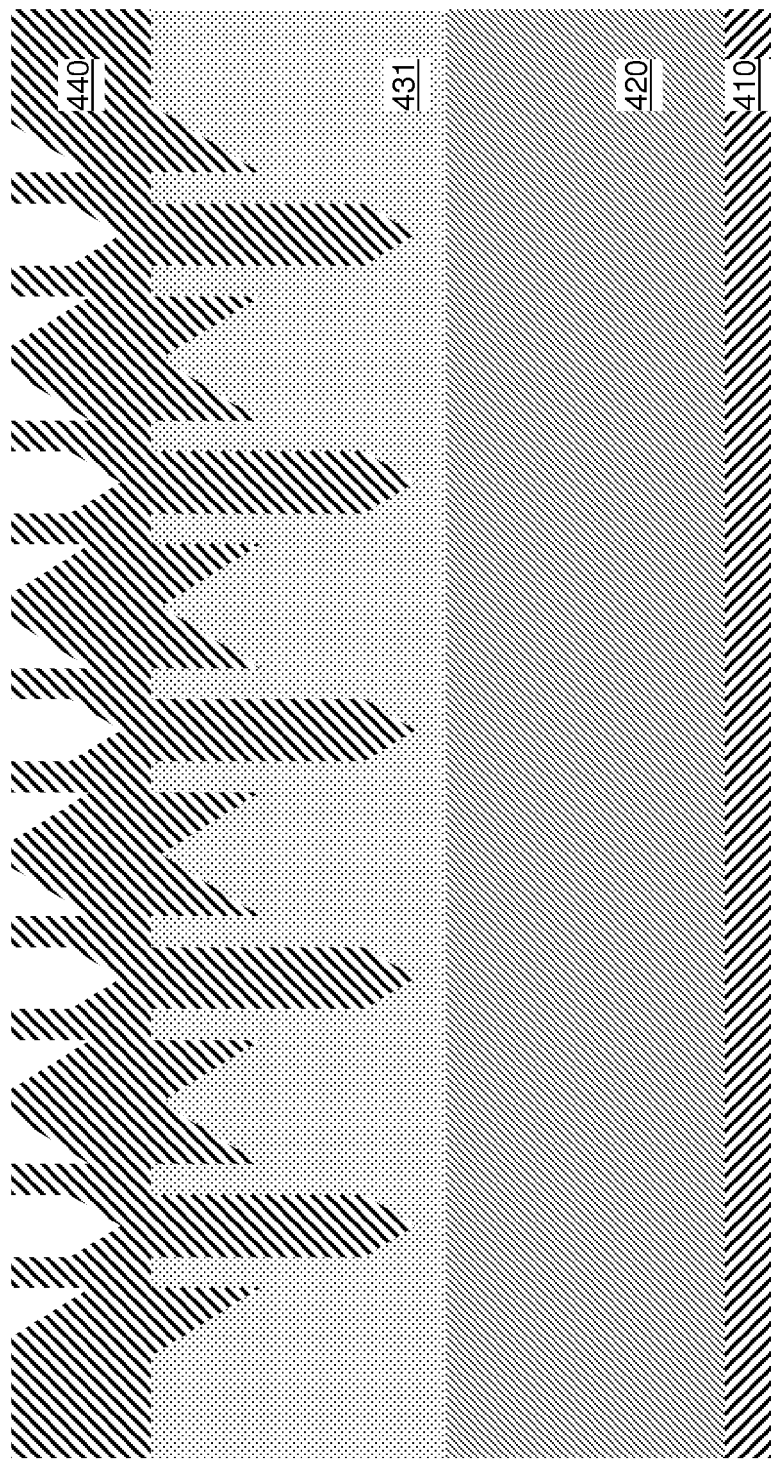
Figure 20:
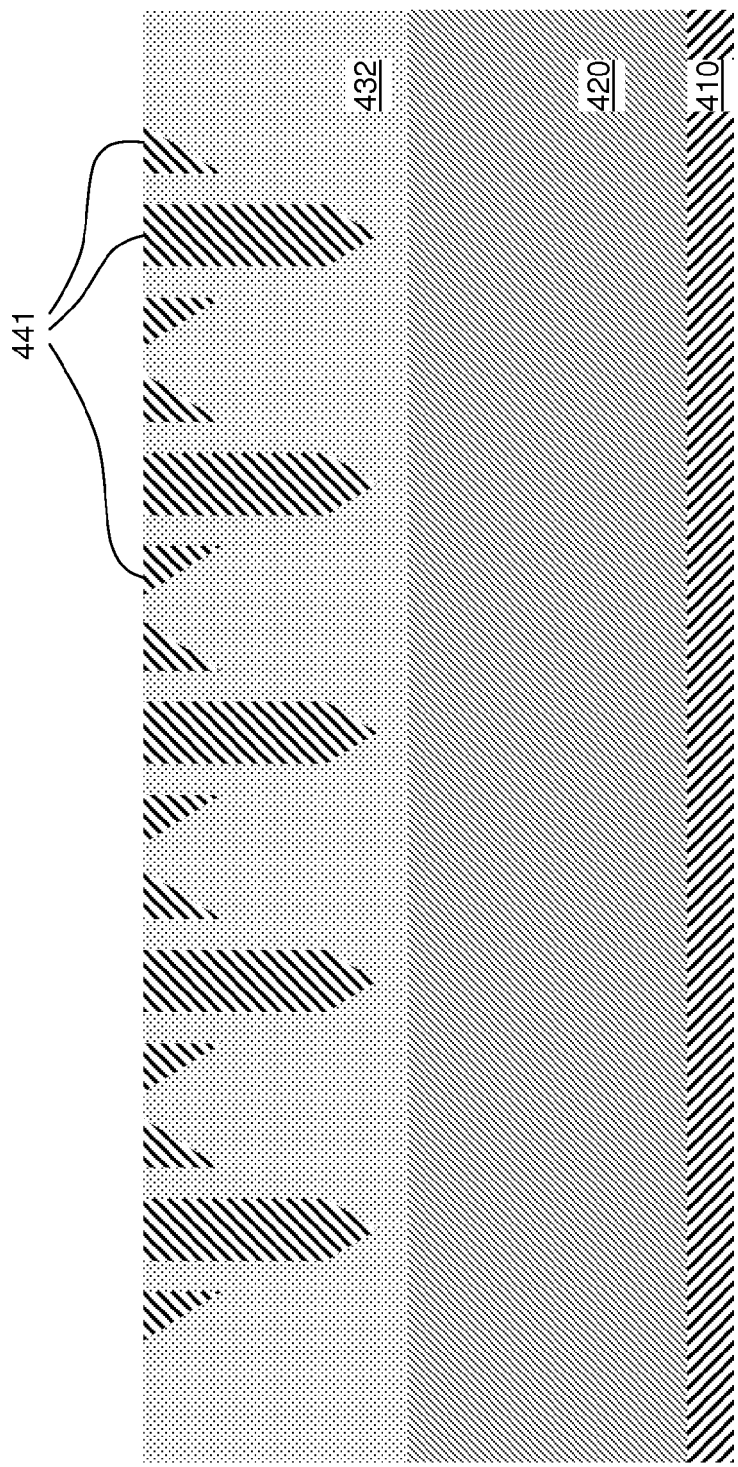
Figure 21:
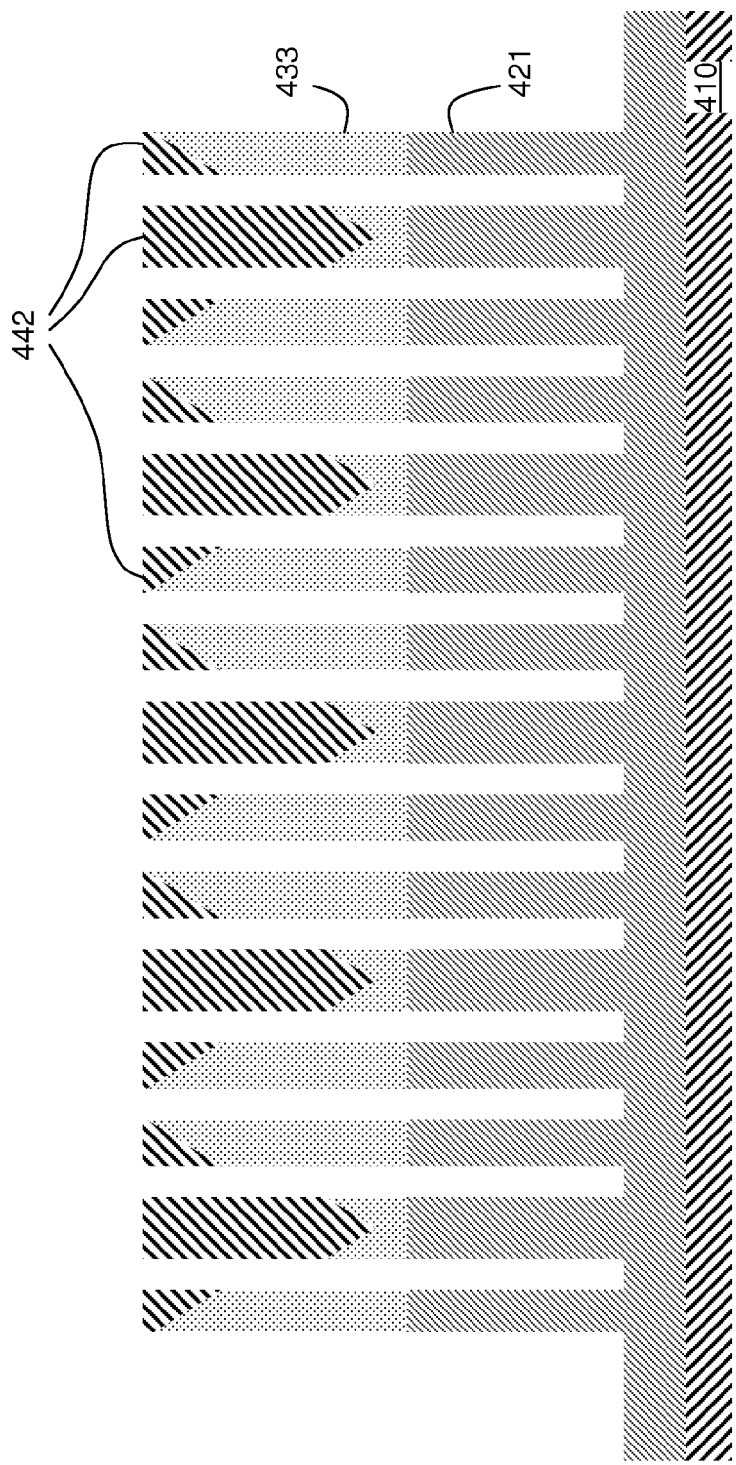

As being illustrated in FIG. 18, mold 40 may be removed or pulled back away from imprinted layer 431 and subsequently a layer of hard mask material 440 may be deposited on top of and covering imprinted layer 431 as being illustrated in FIG. 19. Following the deposition, a CMP process may be applied to polish the deposited hard mask layer 440 until it reaches a desired or pre-determined level where cross-section of the deposited hard mask layer 440, which represents a cross-section of mold 40, provides a pre-determined hard mask pattern such as hard mask 441 as illustrated in FIG. 20. In this particular embodiment, hard mask pattern 441 is made of both first group of pins 41 and second group of pins 42. As being demonstratively illustrated in FIG. 21, hard mask pattern 441 may be used in a subsequent etching process which transfers the pattern into underneath imprinting material layer 432 and dielectric layer 420, creating a relatively dense pattern 421 in dielectric layer 420.

Figure 22:
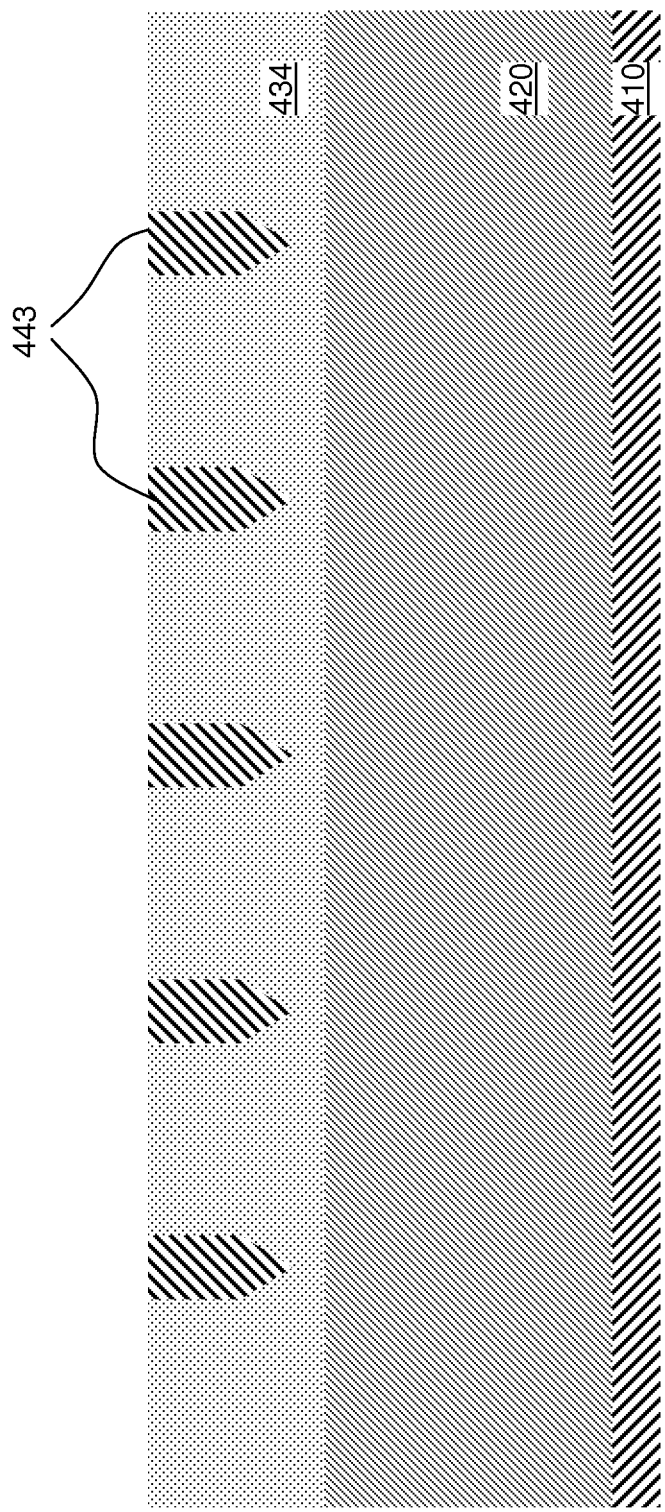
FIGS. 22-23 are demonstratively illustrations of a method of patterning a layer of material according to another embodiment of present invention.
Figure 23:
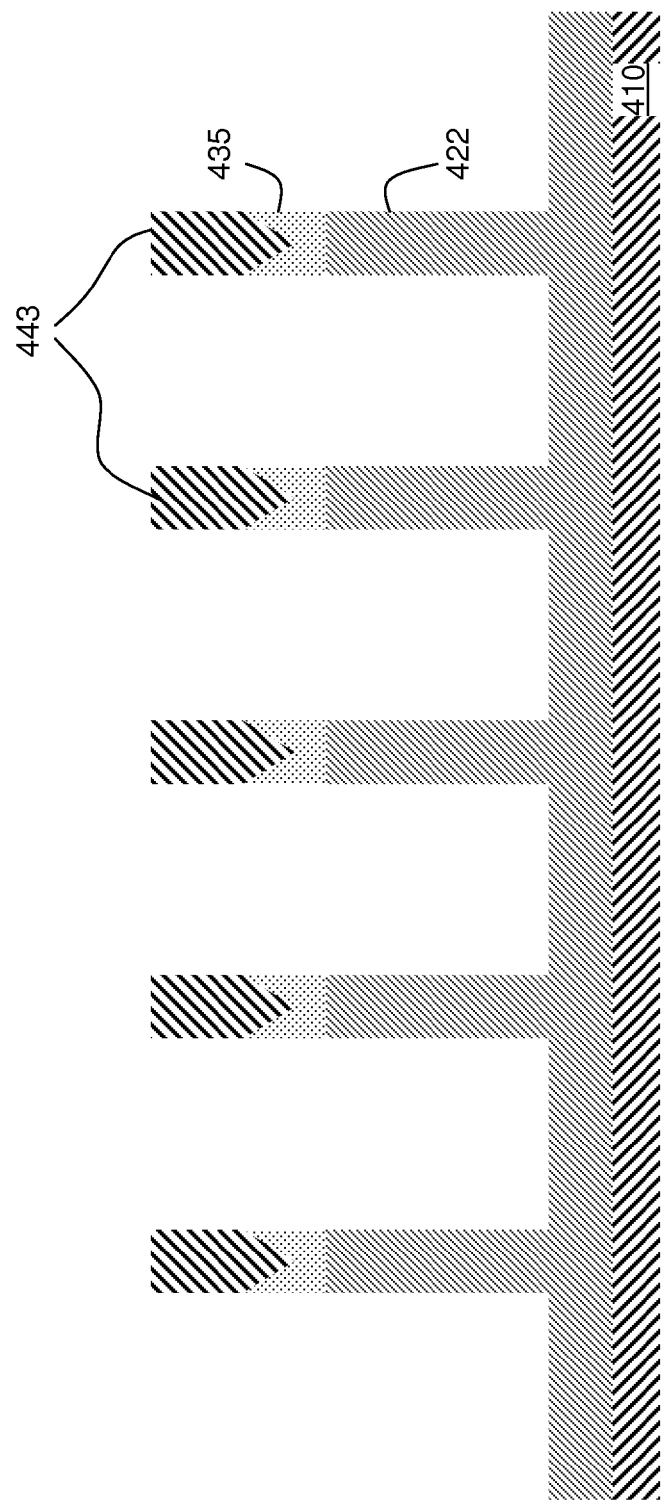
Figure 24:
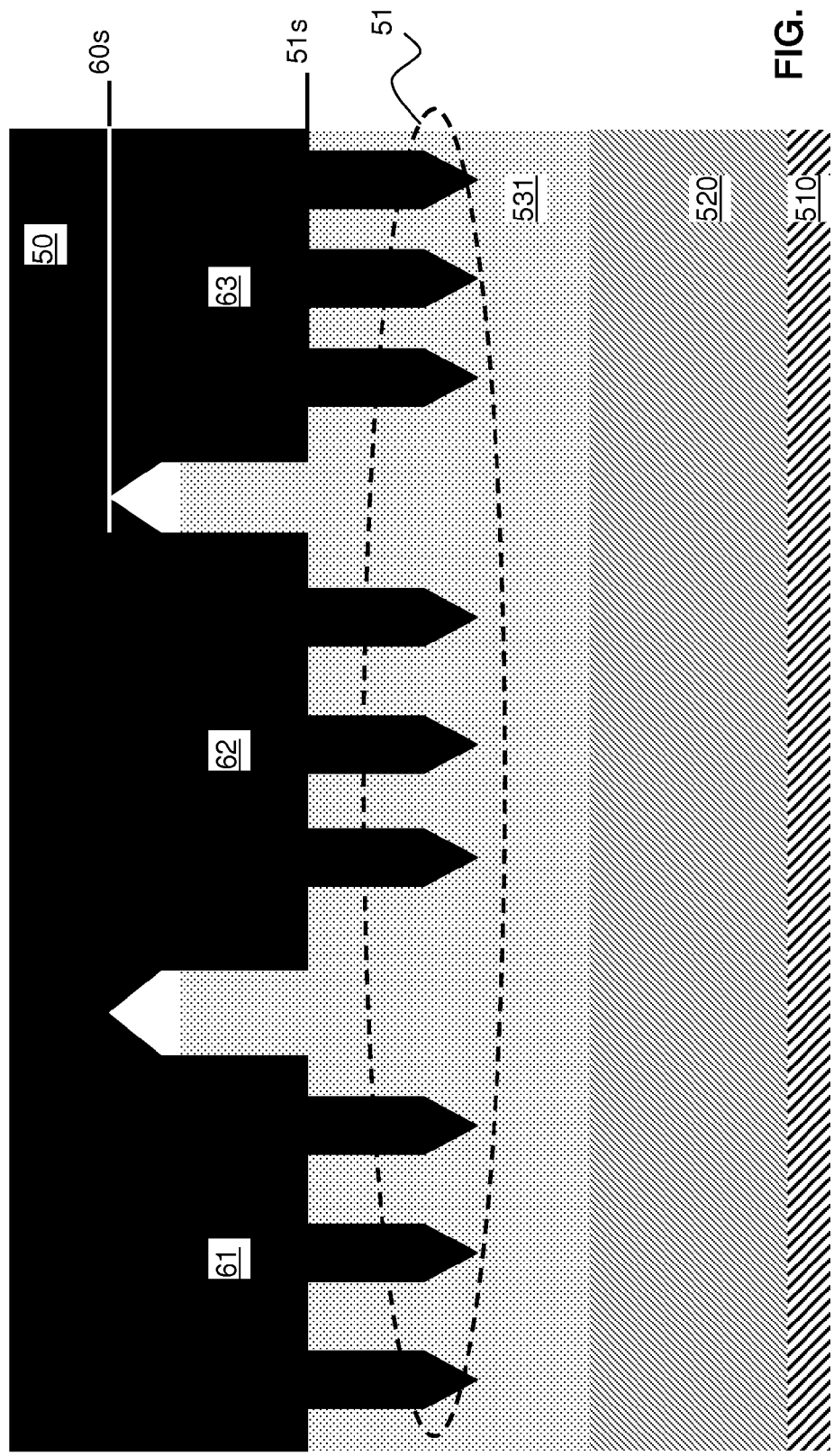
FIGS. 24-28 are demonstratively illustrations of a method of patterning a layer of material according to one embodiment of present invention.
Figure 25:
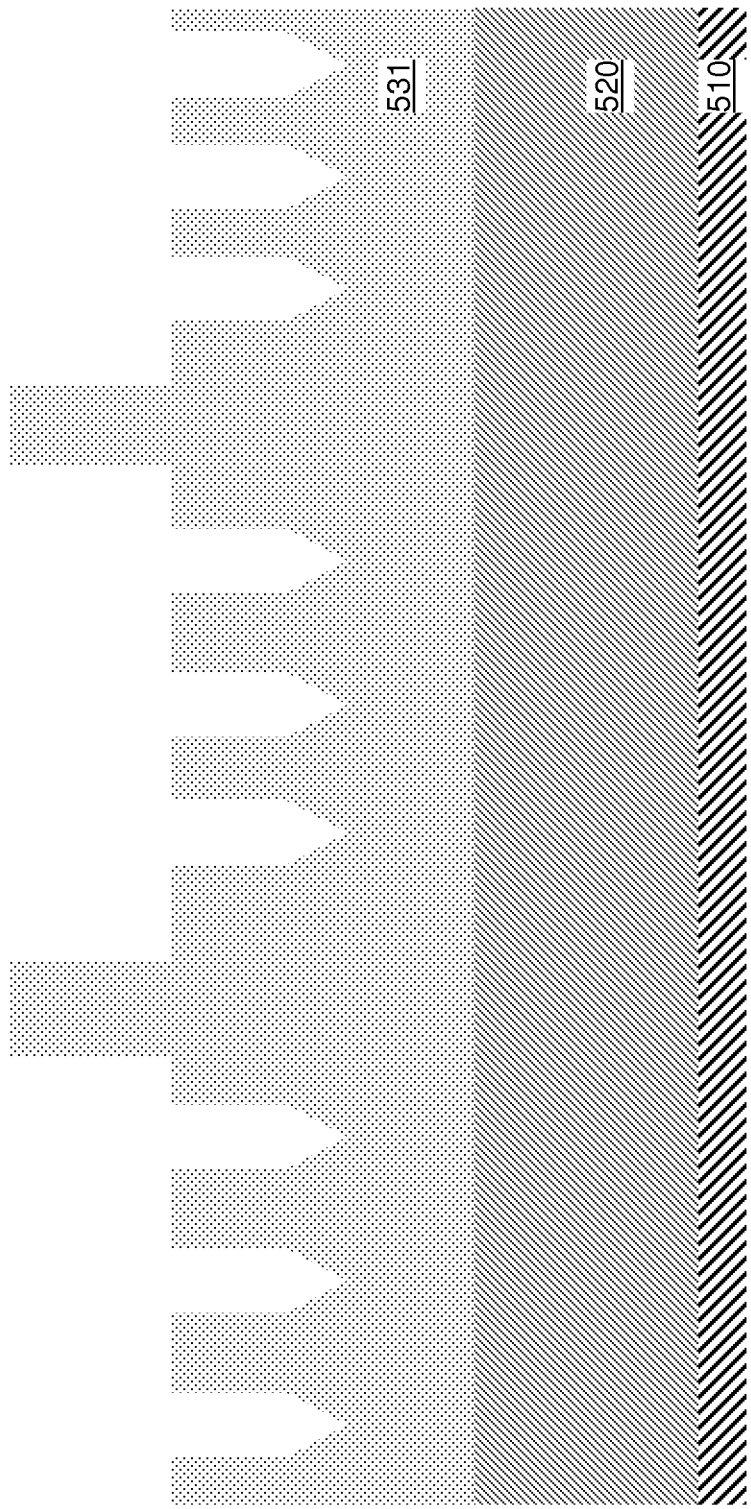
Figure 26:
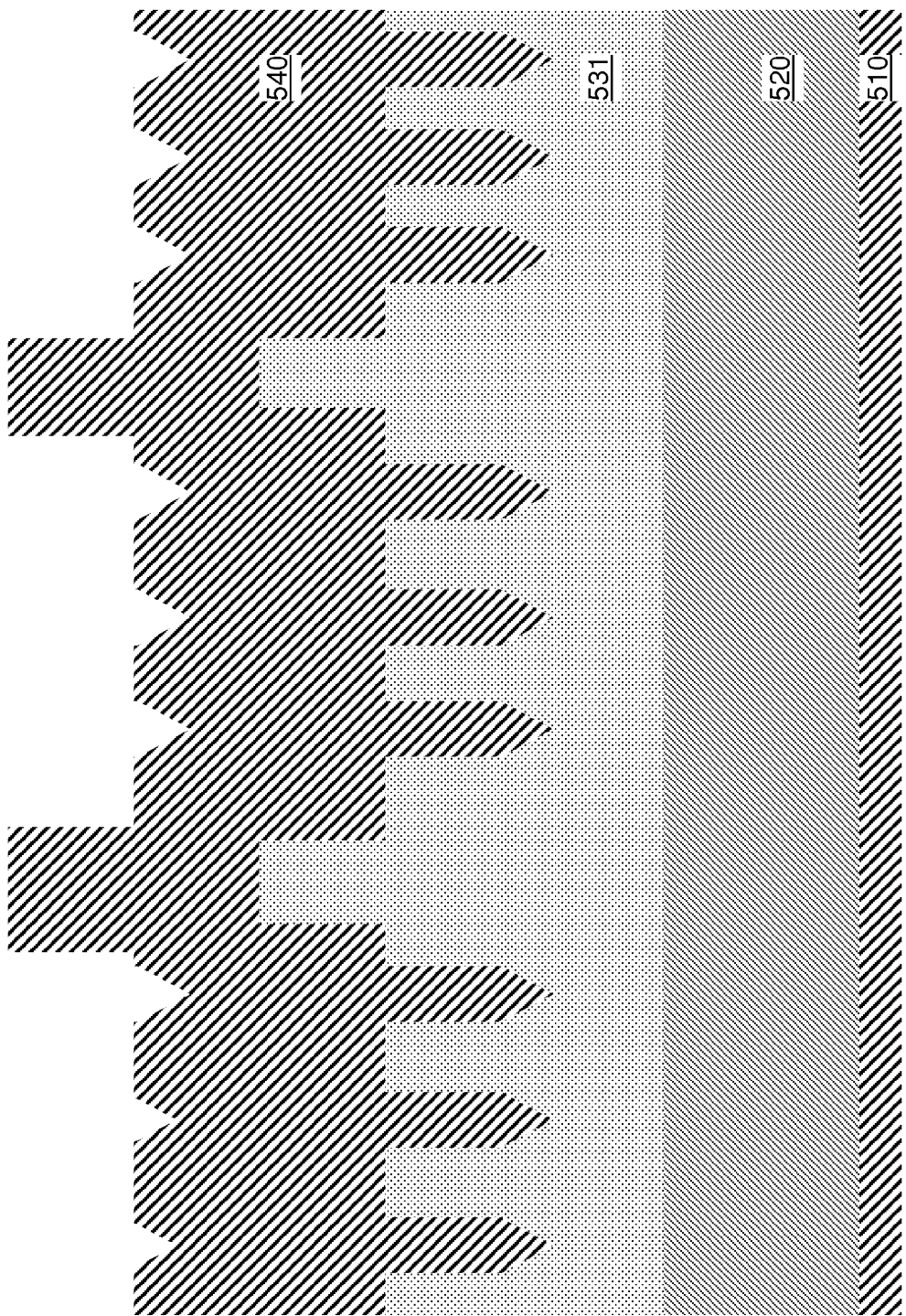
Figure 27:
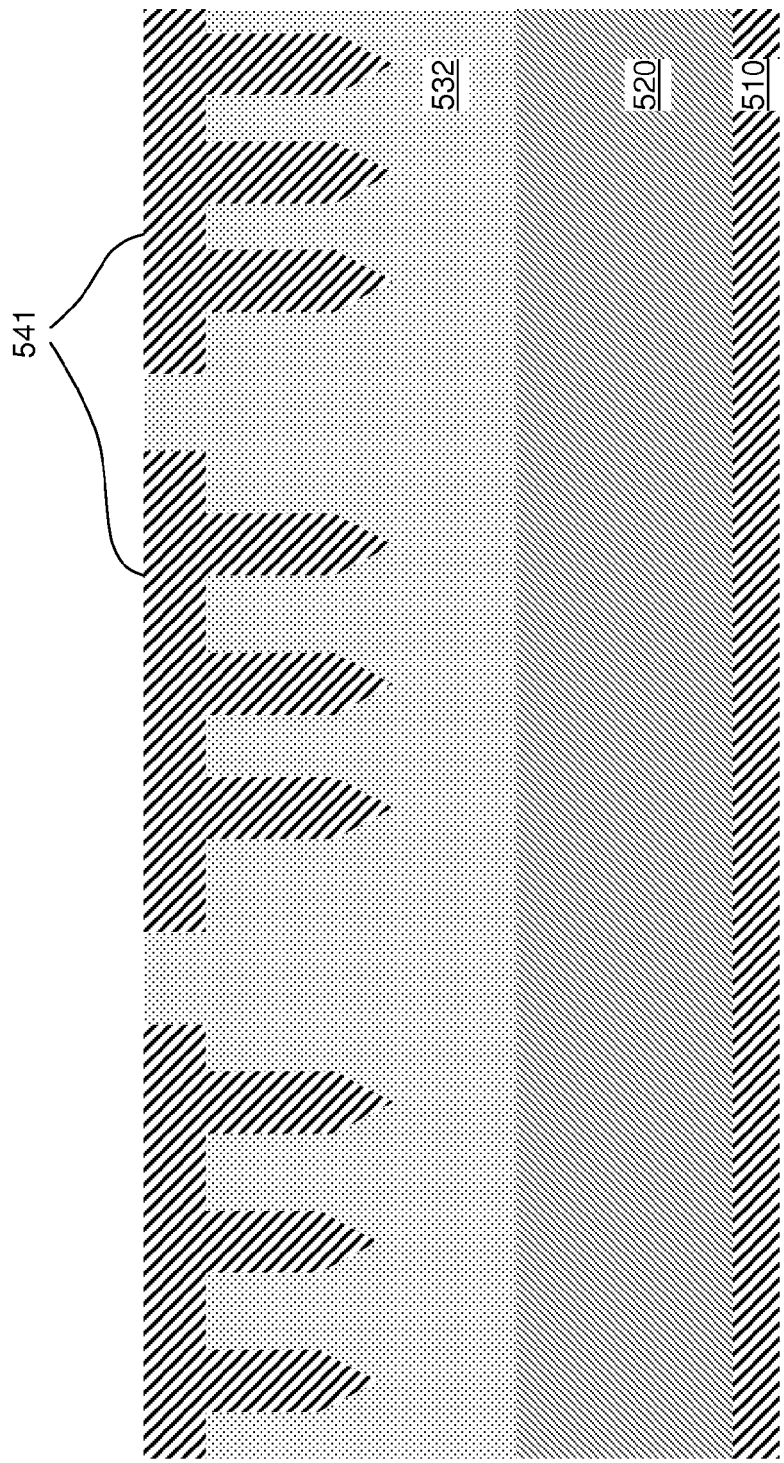
Figure 28:
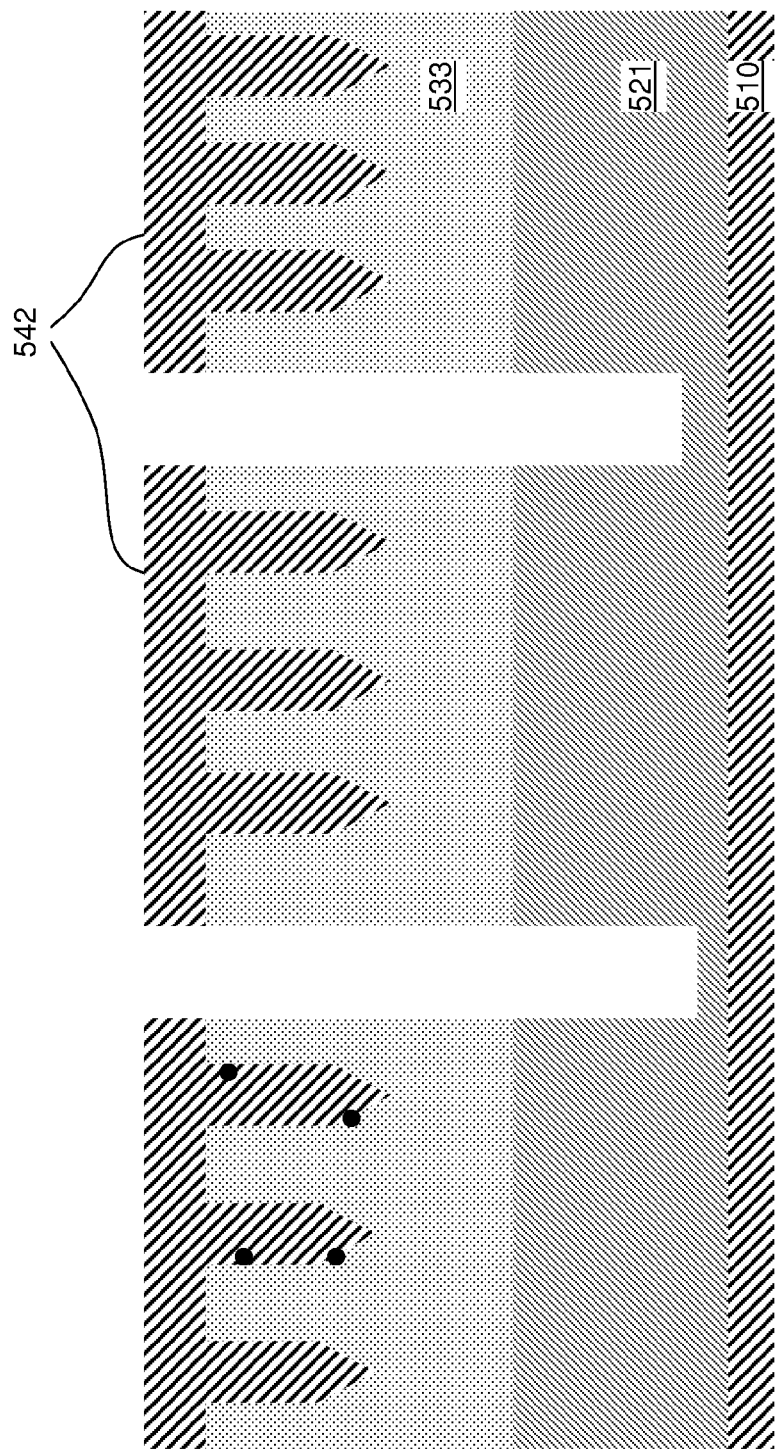

FIGS. 22-23 are demonstratively illustrations of a method of patterning a substrate according to another embodiment of present invention. More specifically, following the deposition of hard mask layer 440, alternatively a CMP process may be applied to remove excess hard mask material 440. In one embodiment, CMP may further be carried out to remove a top portion of hard mask layer 440 until it reaches a level below the second plane level there second group of pins 42 starts. As being demonstratively illustrated in FIG. 22, the CMP process removes all the patterns associated with second group of pins 42 and leaves hard masks 443 associated only with first group of pins 41 inside imprinted layer 434. By comparing with hard mask 441 in FIG. 20, it is clear that hard mask 443 has a relatively large spacing than that of hard mask 441, demonstrating that mold 40 may be used to create different patterns with not only different widths but different spacing. Pattern of hard mask 443 may subsequently be transferred into imprinted layer 434 in a dry or wet etching process to create an etched layer 435, and the pattern 443 may continue to be transferred down into dielectric layer 420 to pattern dielectric layer 420 into a patterned layer 422, as being illustrated in FIG. 23.

FIGS. 24-28 are demonstratively illustrations of a method of patterning a layer of material according to one embodiment of present invention. More specifically, a mold with multi-level of ending planes of pins may be used in an imprinting process. For example, mold 50 may include a first group of pins 51 that end at a first level 51s, and a second group of pins 61-63 that end at a second level 60s. In one embodiment, some of the pins in the first group may be considered as "sub-pins" of a pin of the second group. For example, the most left three pins of first group of pins 51 may be sub-pins of pin 61 of the second group; the middle three pins of first group of pins 51 may be sub-pins of pin 62 of the second group; and the most right three pins of first group of pins 51 may be sub-pins of pin 63 of the second group. Similar to mold 40, mold 50 offers different cross-sectional patterns at different height that may have, for example, different spacings.

According to one embodiment of present invention, mold 50 may be uniformly pushed into imprinting material layer 531 until a height level of imprinting material layer 531, for example a level as may be seen in between pin 62 and pin 63, reaches a level at least above first ending plane 51s. According to one embodiment of present invention, mold 50 may then be pulled back away from imprinted layer 531, as being demonstratively illustrated in FIG. 25, and a hard mask layer 540 may subsequently be applied or deposited on top of imprinted layer 531 to cover imprints made not only by the first group of pins 51 but also imprints made by the second group of pins 61-63, as being demonstratively illustrated in FIG. 26. The top surface of hard mask layer 540 may represent, to certain extent, a topology demonstrated by the recesses made in imprinted layer 531.

According to one embodiment of present invention, a CMP process may be applied to subsequently planarize the top surface of hard mask layer 540 until at least some of imprinted material layer 531 are exposed. For example, the CMP process may be carried out to lower the level of hard mask layer 540 until imprinting material 531 that was pushed into a region corresponding to a region between pins 61 and 62 and between pins 62 and 63 are exposed, as being demonstratively illustrated in FIG. 27. The CMP process turns hard mask layer 540 into hard mask 541.

A RIE process may subsequently be applied to etch imprinting material 532 in spaces between hard mask 541. More particularly, the space may correspond to gaps between second group of pins 61-63 of mold 50. The etching may transfer the pattern of hard mask 541 into imprinted layer 532 to create an etched layer 533, as being demonstratively illustrated in FIG. 28, and a continued etching may further transfer the imprinting material pattern 533 into underneath dielectric layer 520, thereby creating a patterned dielectric layer 521 that sits on top of a substrate layer 510.

Figure 29:
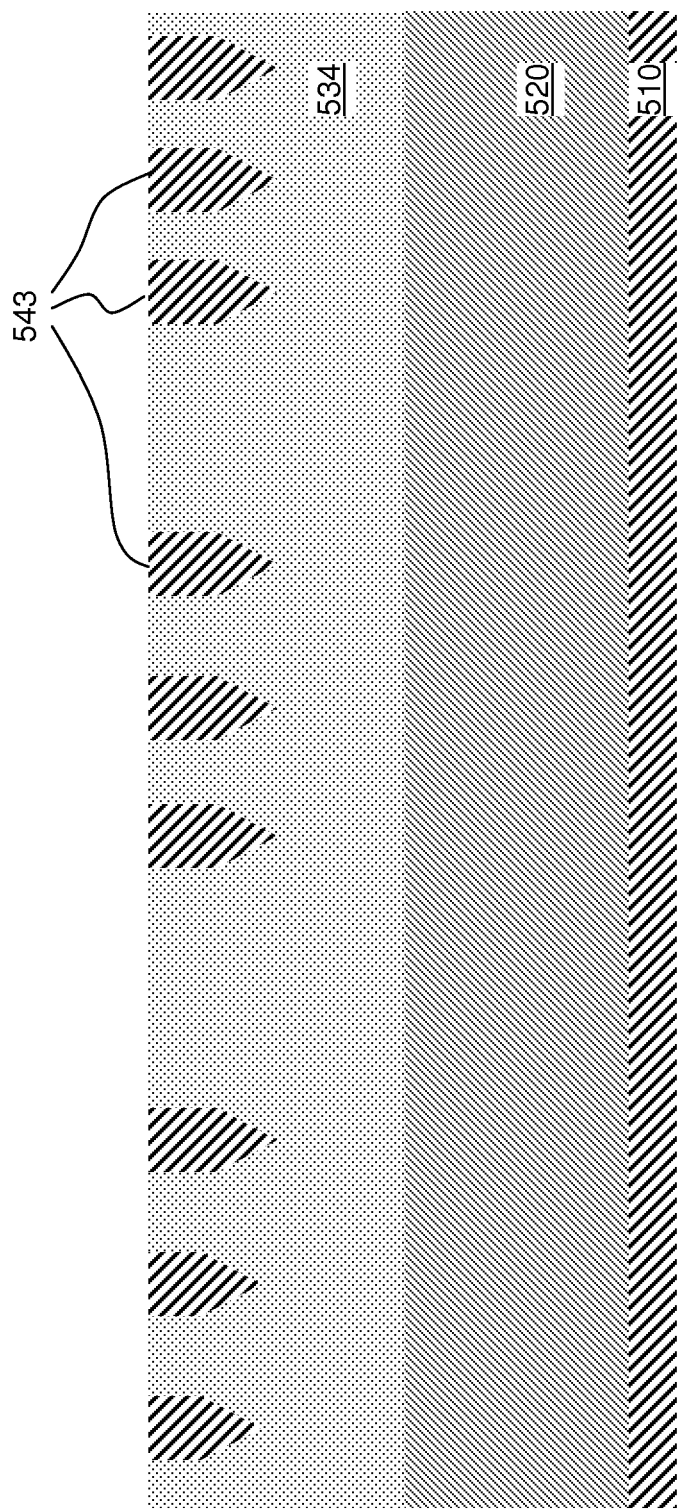
FIGS. 29-30 are demonstratively illustrations of a method of patterning a layer of material according to another embodiment of present invention.
Figure 30:
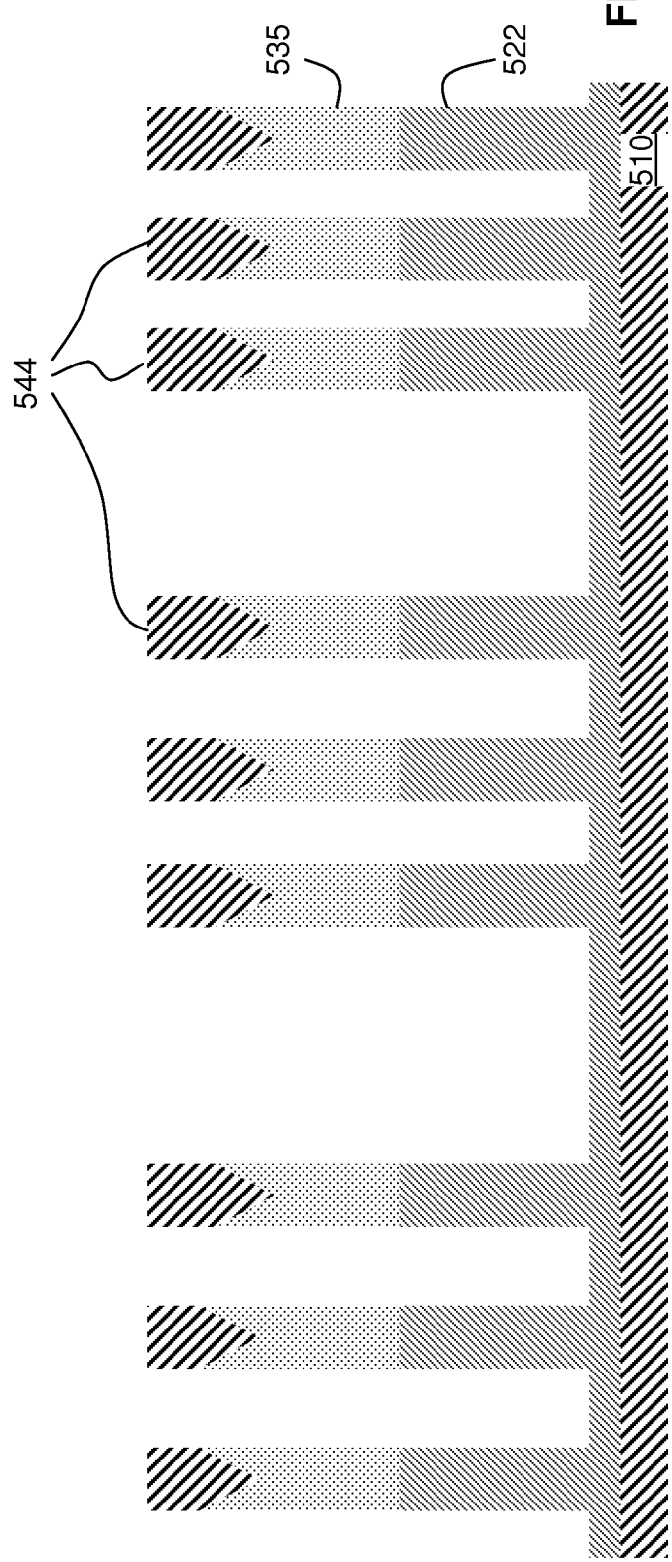

FIGS. 29-30 are demonstratively illustrations of a method of patterning a layer of material according to another embodiment of present invention. For example, the CMP process as being carried out in association of creating hard mask 541 in FIG. 27 may continue until the polished surface becomes below the first ending plane 51s, and only first group of pins 51 remains inside imprinting material layer 534 to become a hard mask 543 as being demonstratively illustrated in FIG. 29. Using hard mask 543 as etch-stops to protect portions of imprinting material layer 534 and dielectric layer 520 directly underneath thereof, the rest exposed imprinting material layer 534 may be etched away in an etching process such as a RIE etching process. The pattern of hard mask 544 may further be transferred into dielectric layer 520 by continuing the etching process passing through etched layer 535. Dielectric layer 520, which sits on top of a substrate 510, may be patterned into a patterned dielectric layer 522.

Figure 32:
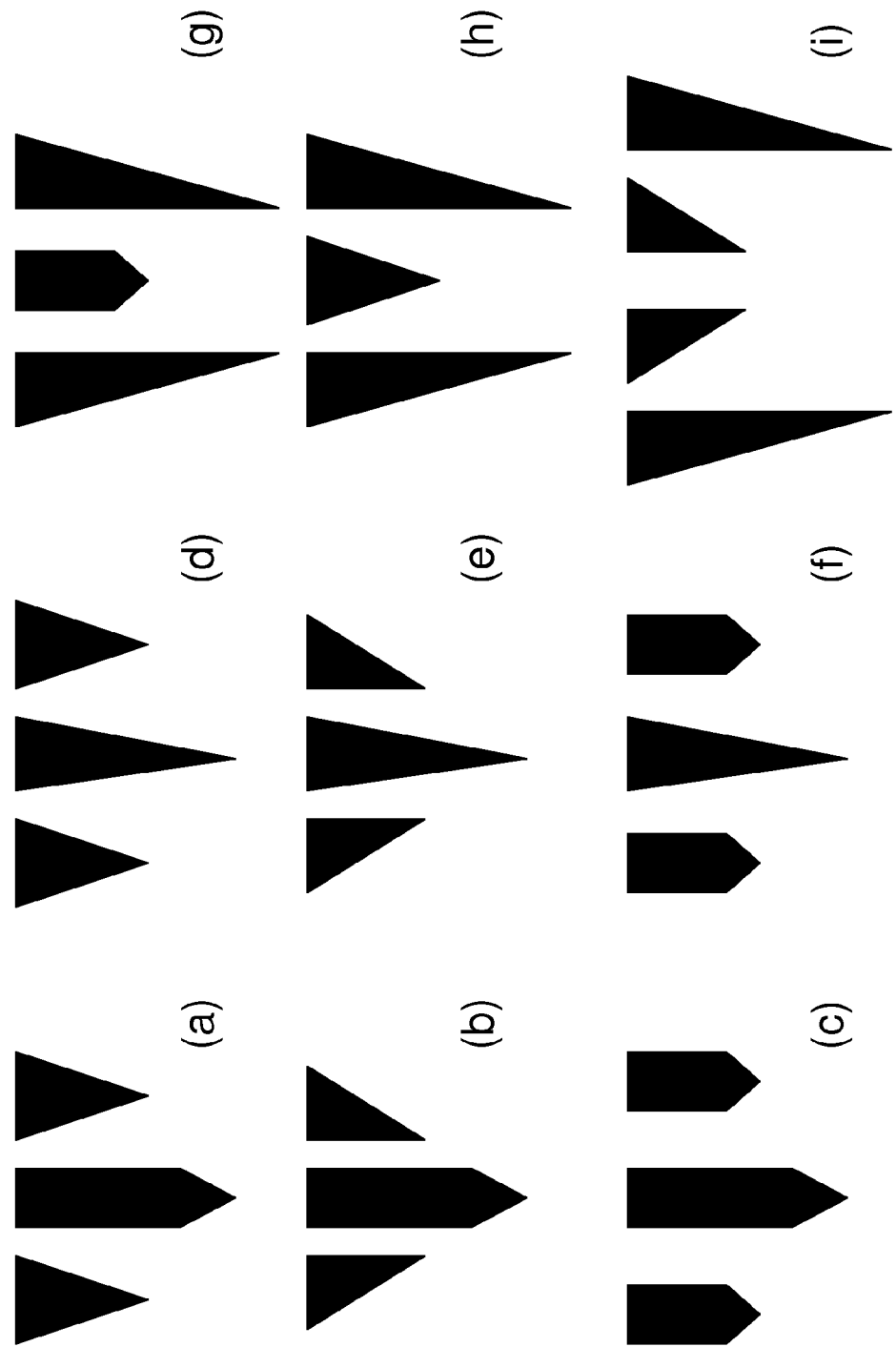
Figure 33:
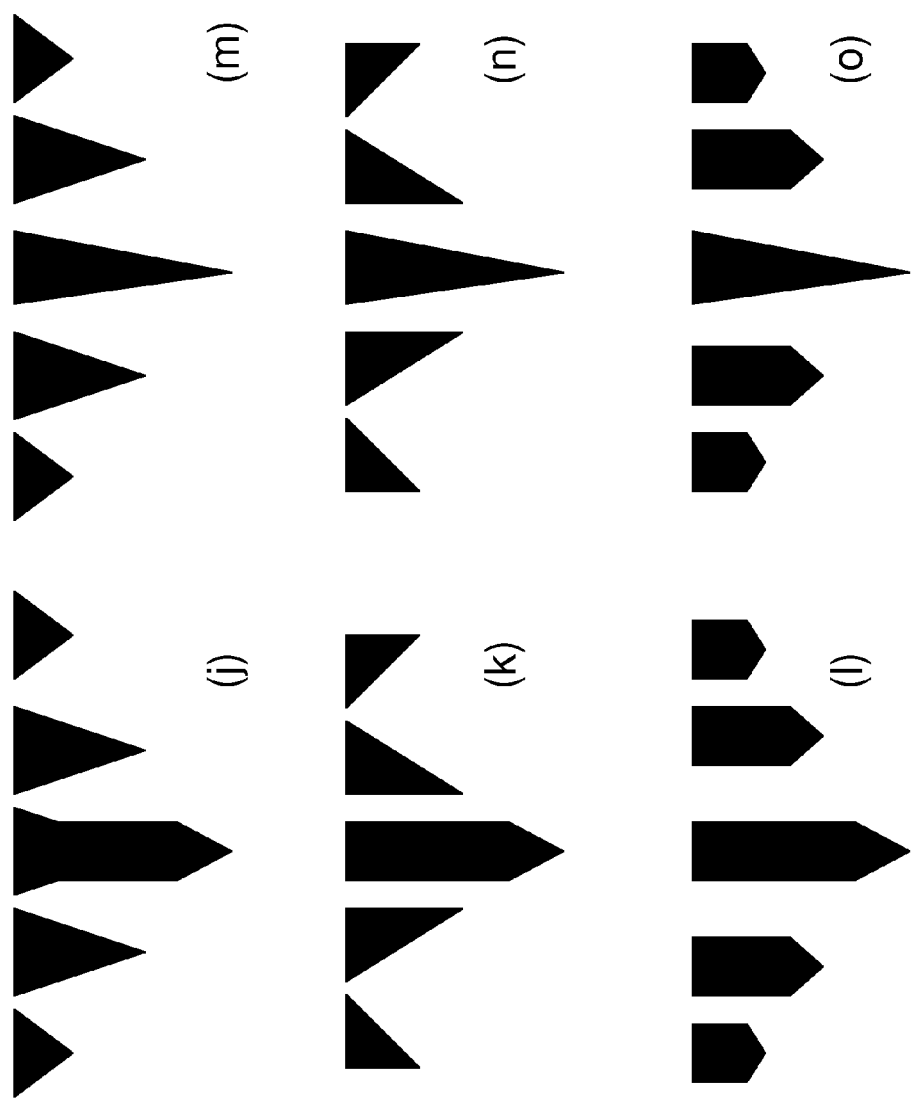
Figure 34:
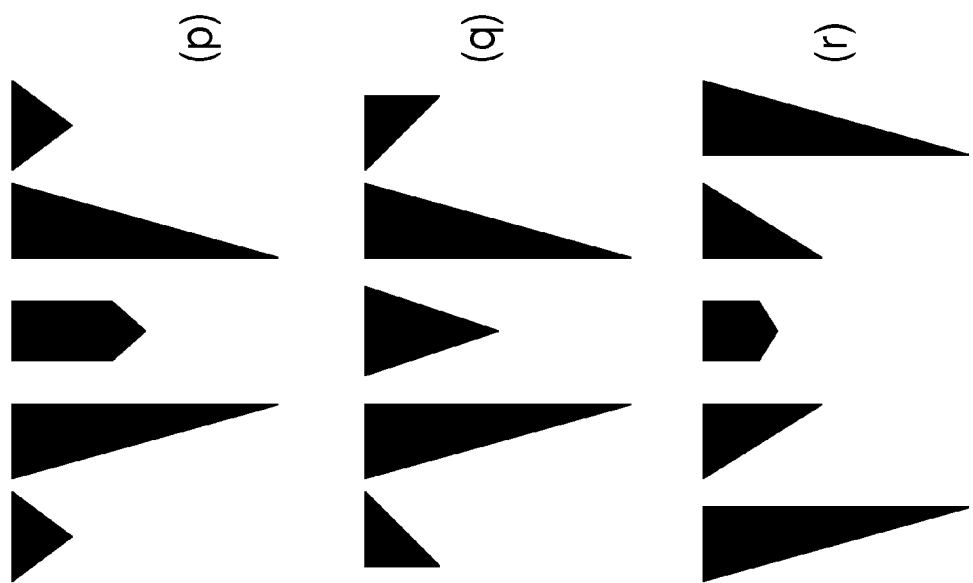
Figure 35:
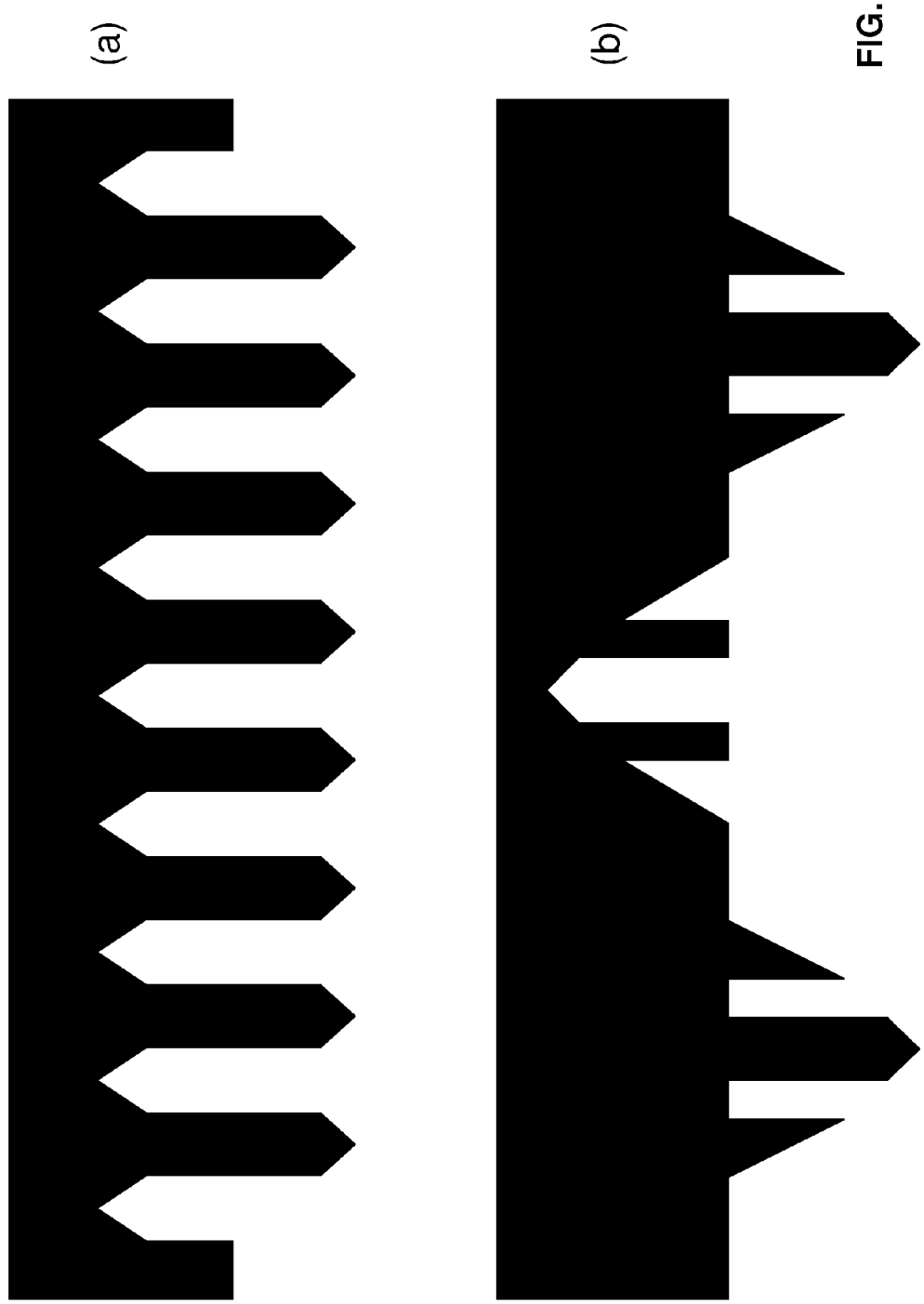

FIGS. 31-35 are demonstratively illustrations of shapes of various pins and molds used in patterning according to embodiments of present invention. More specifically, FIG. 31(a) illustrates a set of basic pins that may be used in forming imprinting mold. The five basic shapes are illustrated only as some non-limiting examples and a person skilled in the art will appreciate that other types of pins may be used as well. Also as non-limiting examples, FIG. 31(b) illustrates some basic pins that may be used in a combination of two, or a combination of three as in FIG. 31(c), in an imprinting mold. FIGS. 32-34 demonstratively illustrate some basic pin sets that may be not only a combination of three or more basic pins but are arranged to have different height. The non-limiting combinations (a)-(o) may be used in imprinting mold that such may be used for imprinting multiple different hard masks. FIG. 35 demonstratively illustrates two different arrangement of pins in a imprinting mold that have different ending planes of the pins in a mold. Such mold may be used similarly as being described above with reference to FIGS. 24-30.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    defining a device pattern to be created in a device layer;
    forming a sacrificial layer on top of said device layer;
    identifying an imprinting mold that, along a height thereof, has a horizontal cross-sectional shape that represents said device pattern;
    pushing said imprinting mold uniformly into said sacrificial layer until at least said position of said imprinting mold reaches a level inside said sacrificial layer that is being pushed by said imprinting mold;
    removing said imprinting mold away from said sacrificial layer;
    forming a hard mask in recesses created by said imprinting mold in said sacrificial layer, said hard mask has a pattern representing said device pattern; and
    transferring said pattern of said hard mask into underneath said device layer,
    wherein pushing said imprinting mold into said sacrificial layer comprises causing said sacrificial layer to rise in height in places where portions of said imprinting mold that face said sacrificial layer do not touch said sacrificial layer.

2. The method of claim 1, wherein forming said sacrificial layer comprises forming a layer of material, said material being selected from a group consisting of siloxane copolymer, thermally-curable liquid resist, UV-curable liquid resist, sealed air Nexcel, and shrink film 955D.

3. The method of claim 1, wherein forming said hard mask comprises:
    depositing a layer of silicon-nitride on top of said sacrificial layer and recesses in said sacrificial layer by an atomic layer deposition (ALD) process; and
    polishing down deposited silicon-nitride, and subsequently a portion of said sacrificial layer, until a top surface created by said polishing reaches said level inside said sacrificial layer, creating said hard mask by using remaining of said silicon-nitride inside said sacrificial layer.

4. The method of claim 3, wherein transferring said pattern of said hard mask comprises:
   directionally etching portions of said sacrificial layer that do not have said hard mask embedded on top thereof to expose corresponding portions of underneath said device layer;
   continuing etching exposed portions of said device layer until a predetermined depth into said device layer is reached; and
   removing remaining portions of said sacrificial layer on top of said device layer.

5. The method of claim 1, further comprising, before forming said hard mask in said recesses, cooling down said sacrificial layer to cause said sacrificial layer to shrink thereby resulting in a reduction in a pitch of said recesses.

6. The method of claim 1, further comprising, before forming said hard mask in said recesses, warming up said sacrificial layer to cause said sacrificial layer to expand thereby resulting in an expansion in a pitch of said recesses.

7. The method of claim 1, wherein said imprinting mold has a first and a second group of pins, and wherein said second group of pins does not touch said sacrificial layer at a same time when said imprinting mold is uniformly pushed into said sacrificial layer to cause said first group of pins touching said sacrificial layer.

8. The method of claim 1, wherein said device layer is a semiconductor substrate.

9. A method comprising:
   forming a sacrificial layer on top of a device layer;
   pushing an imprinting mold uniformly into said sacrificial layer, said imprinting mold has a plurality of pins of funnel shapes and has a horizontal cross-section shape, at a position along a height thereof and among a plurality of different horizontal cross-section shapes, that represents a device pattern;
   continuing pushing said imprinting mold into said sacrificial layer until at least said position of said imprinting mold reaches a top surface of said sacrificial layer;
   removing said imprinting mold from said sacrificial layer;
   forming a hard mask in recesses created by said imprinting mold inside said sacrificial layer, said hard mask has a pattern matching said device pattern; and
   transferring said pattern of said hard mask into underneath said device layer.

10. The method of claim 9, wherein forming said sacrificial layer comprises depositing a layer of material, said material being siloxane copolymer, thermally-curable liquid resist, UV-curable liquid resist, sealed air Nexcel, or shrink film 955D.

11. The method of claim 9, wherein forming said hard mask in said recesses comprises:
   depositing a layer of silicon-nitride on top of said recesses in said sacrificial layer and on top of said sacrificial layer by an atomic layer deposition (ALD) process; and
   removing part of deposited silicon-nitride through a chemical-mechanic-polishing (CMP) process until at least said top surface of said sacrificial layer is exposed, leaving deposited silicon-nitride only inside said recesses forming said hard mask.

12. The method of claim 11, wherein transferring said pattern of said hard mask comprises:
   directionally etching portions of said sacrificial layer that are exposed by said removing part of deposited silicon-nitride, said directionally etching exposes portions of said device layer underneath said portions of said sacrificial layer;
   continuing etching exposed portions of said device layer until a predetermined depth into said device layer is reached; and
   removing remaining portions of said sacrificial layer together with said hard mask on top thereof, said remaining portions of said sacrificial layer being on top of said device layer.

13. The method of claim 9, further comprising, after removing said imprinting mold but before forming said hard mask in said recesses, subjecting said sacrificial layer to an environment of a second temperature different from a first temperature under which said recesses are created, causing said sacrificial layer to either shrink or expand resulting in a different pitch of said recesses.

14. The method of claim 9, wherein pushing said imprinting mold into said sacrificial layer further comprises causing said top surface of said sacrificial layer to rise in areas where a portion of said imprinting mold that faces said sacrificial layer does not touch said top surface of said sacrificial layer.

15. The method of claim 9, wherein some of said plurality of pins do not touch said sacrificial layer when said imprinting mold is initially pushed into said sacrificial layer.

16. A method comprising:
   forming a sacrificial layer on top of a device layer;
   creating a plurality of recesses in said sacrificial layer, wherein a horizontal cross-section shape of said plurality of recesses, at a position along a height of said sacrificial layer, represents a device pattern;
   subjecting said sacrificial layer to an environment of a second temperature different from a first temperature at which said plurality of recesses are created, causing said sacrificial layer to either shrink or expand resulting in a different pitch of said plurality of recesses;
   forming a hard mask in said plurality of recesses, a top surface of said hard mask having a pattern matching said device pattern; and
   etching portions of said device layer that are not covered vertically by said hard mask, thereby transferring said pattern of said hard mask into underneath said device layer.

17. The method of claim 16, wherein creating said plurality of recesses comprises:
   pushing an imprinting mold uniformly into said sacrificial layer, said imprinting mold has a horizontal cross-section shape, at a position along a height thereof, that represents said device pattern;
   continuing pushing said imprinting mold into said sacrificial layer until at least said position of said imprinting mold reaches a top surface of said sacrificial layer; and
   removing said imprinting mold from said sacrificial layer.

18. The method of claim 16, wherein forming said sacrificial layer comprises depositing a layer of material, said material being selected from a group consisting of siloxane copolymer, thermally-curable liquid resist, UV-curable liquid resist, sealed air Nexcel, and shrink film 955D.

19. The method of claim 16, wherein forming said hard mask comprises:
   depositing a layer of silicon-nitride on top of said recesses in said sacrificial layer and on a top surface of said sacrificial layer by an atomic layer deposition (ALD) process; and
   removing part of deposited silicon-nitride through a chemical-mechanic-polishing (CMP) process until at least said top surface of said sacrificial layer is exposed, leaving deposited silicon-nitride only inside said recesses to form said hard mask.

20. The method of claim 17, wherein pushing said imprinting mold into said sacrificial layer further comprises causing said top surface of said sacrificial layer to rise in height in areas where portions of said imprinting mold that face said sacrificial layer do not touch said sacrificial layer.

21. The method of claim 17, wherein said imprinting mold has a plurality of pins and at least some of said plurality of pins are not used in creating said plurality of recesses in said sacrificial layer when said imprinting mold is uniformly pushed into said sacrificial layer.

* * * * *